US011658163B2

(12) United States Patent
Meir et al.

(10) Patent No.: US 11,658,163 B2
(45) Date of Patent: May 23, 2023

(54) LIGHTING SYSTEMS WITH HIGH COLOR RENDERING INDEX AND UNIFORM PLANAR ILLUMINATION

(71) Applicant: Korrus, Inc., Los Angeles, CA (US)

(72) Inventors: Noam Meir, Herzliya (IL); Ariel Meir, North Miami Beach, FL (US)

(73) Assignee: KORRUS, INC., Los Angeles, CA (US)

(*) Notice: Subject to any disclaimer, the term of this patent is extended or adjusted under 35 U.S.C. 154(b) by 0 days.

(21) Appl. No.: 17/653,988

(22) Filed: Mar. 8, 2022

(65) Prior Publication Data
US 2022/0336424 A1 Oct. 20, 2022

Related U.S. Application Data

(63) Continuation of application No. 16/480,867, filed as application No. PCT/US2018/015449 on Jan. 26, 2018, now Pat. No. 11,296,057.
(Continued)

(51) Int. Cl.
*F21S 4/20* (2016.01)
*F21K 9/64* (2016.01)
(Continued)

(52) U.S. Cl.
CPC ............ *H01L 25/0753* (2013.01); *F21K 9/64* (2016.08); *F21K 9/90* (2013.01); *F21S 4/20* (2016.01);
(Continued)

(58) Field of Classification Search
None
See application file for complete search history.

(56) References Cited

U.S. PATENT DOCUMENTS

| 3,262,250 A | 7/1966 | Fowler |
| 3,434,897 A | 3/1969 | Caretta |

(Continued)

FOREIGN PATENT DOCUMENTS

| CA | 2623604 | 8/2009 |
| CN | 101592291 A | 12/2009 |

(Continued)

OTHER PUBLICATIONS

International Patent Application No. PCT/US2018/015449; Int'l Preliminary Report on Patentability; dated Aug. 8, 2019; 8 pages.
(Continued)

*Primary Examiner* — Ashok Patel
(74) *Attorney, Agent, or Firm* — Jay M. Brown

(57) ABSTRACT

Aspects of the present disclosure relate to a lighting device that is configured to provide light with a high color rendering index (CRI) value and/or uniform planar illumination. The lighting device may include a circuit board, a light emitting diode (LED) mounted to the circuit board and configured to emit broad spectrum light having a first CRI value, a photo-luminescent material disposed above the LED mounted to the circuit board configured to increase the CRI of the broad spectrum light emitted by the LED from the first CRI value to a higher, second CRI value, and an elastomer encapsulating at least part of the circuit board. Additionally, the lighting device may include a lens disposed over the LED configured to increase the maximum emission angle of light from the LED and a diffuser disposed above the lens and configured to diffuse the broad spectrum light.

10 Claims, 10 Drawing Sheets

Related U.S. Application Data

(60) Provisional application No. 62/451,612, filed on Jan. 27, 2017, provisional application No. 62/451,616, filed on Jan. 27, 2017.

(51) Int. Cl.
 *F21V 9/35* (2018.01)
 *F21K 9/90* (2016.01)
 *H01L 33/50* (2010.01)
 *H01L 25/075* (2006.01)
 *H05B 45/20* (2020.01)

(52) U.S. Cl.
 CPC .............. *F21V 9/35* (2018.02); *H01L 33/504* (2013.01); *H05B 45/20* (2020.01)

(56) References Cited

U.S. PATENT DOCUMENTS

| | | |
|---|---|---|
| 4,445,164 A | 4/1984 | Giles, III |
| 4,580,859 A | 4/1986 | Frano |
| 4,603,496 A | 8/1986 | Latz |
| 4,727,648 A | 3/1988 | Savage, Jr. |
| 4,837,927 A | 6/1989 | Savage, Jr. |
| 5,087,212 A | 2/1992 | Hanami |
| 5,174,649 A | 12/1992 | Alston |
| 5,241,457 A | 8/1993 | Sasajima |
| 5,387,901 A | 2/1995 | Hardt |
| 5,436,809 A | 7/1995 | Brassier |
| 5,450,664 A | 9/1995 | Babow |
| 5,490,048 A | 2/1996 | Brassier |
| 5,628,557 A | 5/1997 | Huang |
| 5,632,551 A | 5/1997 | Roney |
| 5,658,066 A | 8/1997 | Hirsch |
| 5,821,695 A | 10/1998 | Vilanilam |
| 6,283,612 B1 | 9/2001 | Hunter |
| 6,354,714 B1 | 3/2002 | Rhodes |
| 6,426,704 B1 | 7/2002 | Hutchison |
| 6,439,743 B1 | 8/2002 | Hutchison |
| 6,450,662 B1 | 9/2002 | Hutchison |
| 6,450,664 B1 | 9/2002 | Kelly |
| 6,473,002 B1 | 10/2002 | Hutchison |
| 6,474,839 B1 | 11/2002 | Hutchison |
| 6,481,130 B1 | 11/2002 | Wu |
| 6,527,422 B1 | 3/2003 | Hutchison |
| 6,530,674 B2 | 3/2003 | Grierson |
| 6,582,103 B1 | 6/2003 | Popovich |
| 6,590,235 B2 | 7/2003 | Carey |
| 6,601,970 B2 | 8/2003 | Ueda |
| 6,676,284 B1 | 1/2004 | Wynne Willson |
| 6,773,138 B2 | 8/2004 | Coushaine |
| 6,824,296 B2 | 11/2004 | Souza |
| 6,827,469 B2 | 12/2004 | Coushaine |
| 6,851,832 B2 | 2/2005 | Tieszen |
| 6,880,952 B2 | 4/2005 | Kiraly |
| 6,882,111 B2 | 4/2005 | Kan |
| 6,893,144 B2 | 5/2005 | Fan |
| 6,979,097 B2 | 12/2005 | Elam |
| 7,093,958 B2 | 8/2006 | Coushaine |
| 7,111,964 B2 | 9/2006 | Suehiro |
| 7,112,926 B2 | 9/2006 | Himori |
| 7,132,804 B2 | 11/2006 | Lys |
| 7,150,553 B2 | 12/2006 | English |
| 7,159,997 B2 | 1/2007 | Reo |
| 7,161,311 B2 | 1/2007 | Mueller |
| 7,210,957 B2 | 5/2007 | Mrakovich |
| 7,221,104 B2 | 5/2007 | Lys |
| 7,229,192 B2 | 6/2007 | Mayfield, III |
| 7,261,435 B2 | 8/2007 | Gould |
| 7,267,461 B2 | 9/2007 | Kan |
| 7,360,925 B2 | 4/2008 | Coushaine |
| 7,414,269 B2 | 8/2008 | Stefan |
| 7,455,422 B2 | 11/2008 | Gould |
| 7,456,499 B2 | 11/2008 | Loh |
| 7,481,552 B2 | 1/2009 | Mayfield, III |
| 7,481,566 B2 | 1/2009 | Han |
| 7,530,716 B2 | 5/2009 | Mayfield, III |
| 7,540,761 B2 | 6/2009 | Weber |
| 7,549,786 B2 | 6/2009 | Higley |
| 7,575,332 B2 | 8/2009 | Cok |
| 7,595,113 B2 | 9/2009 | Miyoshi |
| 7,604,365 B2 | 10/2009 | Chang |
| 7,654,703 B2 | 2/2010 | Kan |
| 7,700,965 B2 | 4/2010 | Chang |
| 7,703,951 B2 | 4/2010 | Piepgras |
| 7,712,926 B2 | 5/2010 | Matheson |
| 7,727,009 B2 | 6/2010 | Goto |
| 7,731,396 B2 | 6/2010 | Fay |
| 7,744,266 B2 | 6/2010 | Higley |
| 7,766,518 B2 | 8/2010 | Piepgras |
| 7,806,562 B2 | 10/2010 | Behr |
| 7,810,955 B2 | 10/2010 | Stimac |
| 7,810,995 B2 | 10/2010 | Fadler |
| 7,841,753 B2 | 11/2010 | Liu |
| 7,857,482 B2 | 12/2010 | Reo |
| 7,866,847 B2 | 1/2011 | Zheng |
| 7,878,683 B2 | 2/2011 | Logan |
| 7,918,589 B2 | 4/2011 | Mayfield, III |
| 7,922,364 B2 | 4/2011 | Tessnow |
| 7,923,907 B2 | 4/2011 | Tessnow |
| 7,952,114 B2 | 5/2011 | Gingrich, III |
| 7,961,113 B2 | 6/2011 | Rabiner |
| 7,972,038 B2 | 7/2011 | Albright |
| 7,988,336 B1 | 8/2011 | Harbers |
| 7,997,758 B2 | 8/2011 | Zhang |
| 8,033,680 B2 | 10/2011 | Sharrah |
| 8,052,310 B2 | 11/2011 | Gingrinch, III |
| 8,066,403 B2 | 11/2011 | Sanfilippo |
| 8,076,683 B2 | 12/2011 | Xu |
| 8,113,680 B2 | 2/2012 | O'Brien |
| 8,118,454 B2 | 2/2012 | Rains, Jr. |
| 8,154,864 B1 | 4/2012 | Nearman |
| 8,172,436 B2 | 5/2012 | Coleman |
| 8,207,546 B2 | 6/2012 | Harada |
| 8,256,930 B2 | 9/2012 | Cheng |
| 8,262,250 B2 | 9/2012 | Li |
| 8,272,758 B2 | 9/2012 | Meir |
| 8,297,788 B2 | 10/2012 | Bishop |
| 8,314,566 B2 | 11/2012 | Steele |
| 8,348,460 B2 | 1/2013 | Bachl |
| 8,371,723 B2 | 2/2013 | Nall |
| 8,434,897 B2 | 5/2013 | Logan |
| 8,434,898 B2 | 5/2013 | Sanfilippo |
| 8,449,128 B2 | 5/2013 | Ko |
| 8,454,193 B2 | 6/2013 | Simon |
| 8,525,190 B2 | 9/2013 | Donofrio |
| 8,545,045 B2 | 10/2013 | Tress |
| 8,552,456 B1 | 10/2013 | Sun |
| 8,575,646 B1 | 11/2013 | Shum |
| 8,598,778 B2 | 12/2013 | Allen |
| 8,616,720 B2 | 12/2013 | Carney |
| 8,676,284 B2 | 3/2014 | He |
| 8,690,368 B1 | 4/2014 | Shipman |
| 8,697,458 B2 | 4/2014 | Nolan |
| 8,702,265 B2 | 4/2014 | May |
| 8,748,202 B2 | 6/2014 | Kwon |
| 8,755,665 B2 | 6/2014 | Hong |
| 8,764,220 B2 | 7/2014 | Chan |
| 8,791,485 B2 | 7/2014 | Ohbayashi |
| 8,820,964 B2 | 9/2014 | Gould |
| 8,858,607 B1 | 10/2014 | Jones |
| 8,876,322 B2 | 11/2014 | Alexander |
| 8,876,325 B2 | 11/2014 | Lu |
| 8,893,144 B2 | 11/2014 | Haham |
| 8,969,894 B2 | 3/2015 | Lee |
| 8,998,448 B2 | 4/2015 | Chang |
| 9,016,895 B2 | 4/2015 | Handsaker |
| 9,022,603 B1 | 5/2015 | Moghal |
| 9,052,075 B2 | 6/2015 | Demuynck |
| 9,091,422 B2 | 7/2015 | Greenfield |
| 9,157,622 B2 | 10/2015 | Yanping |
| 9,188,290 B2 | 11/2015 | Lay |
| 9,285,085 B2 | 3/2016 | Carney |
| 9,295,855 B2 | 3/2016 | Jones |

(56) References Cited

U.S. PATENT DOCUMENTS

| | | |
|---|---|---|
| 9,518,706 B2 | 12/2016 | Chan |
| 9,605,812 B2 | 3/2017 | Van De Ven |
| 9,651,227 B2 | 5/2017 | Pickard |
| 9,666,772 B2 | 5/2017 | Ibbetson |
| 9,722,158 B2 | 8/2017 | Chan |
| 9,874,333 B2 | 1/2018 | Lay |
| 9,976,710 B2 | 5/2018 | Meir |
| 9,995,444 B2 | 6/2018 | Leichner |
| 10,030,828 B2 | 7/2018 | Meir |
| 10,100,988 B2 | 10/2018 | Rodgers |
| 10,132,476 B2 | 11/2018 | Meir |
| 10,228,099 B2 | 3/2019 | Meir |
| 10,378,705 B2 | 8/2019 | Meir |
| 10,465,864 B2 | 11/2019 | Leichner |
| 10,584,860 B2 | 3/2020 | Dungan |
| 10,612,747 B2 | 4/2020 | Rodgers |
| 10,989,372 B2 | 4/2021 | Meir |
| 2002/0114155 A1 | 8/2002 | Katogi |
| 2002/0117692 A1 | 8/2002 | Lin |
| 2003/0058658 A1 | 3/2003 | Lee |
| 2003/0072156 A1 | 4/2003 | Pohlert |
| 2003/0198049 A1 | 10/2003 | Hulse |
| 2003/0223235 A1 | 12/2003 | Mohacsi |
| 2004/0052076 A1 | 3/2004 | Mueller |
| 2004/0070855 A1 | 4/2004 | Benitez |
| 2004/0105261 A1 | 6/2004 | Ducharme |
| 2004/0218386 A1 | 11/2004 | Doll |
| 2005/0092517 A1 | 5/2005 | Fan |
| 2005/0221518 A1 | 10/2005 | Andrews |
| 2005/0225985 A1 | 10/2005 | Catalano |
| 2005/0280016 A1 | 12/2005 | Mok |
| 2005/0286265 A1 | 12/2005 | Zampini |
| 2006/0077687 A1 | 4/2006 | Higashiyama |
| 2006/0134440 A1 | 6/2006 | Crivello |
| 2006/0141851 A1 | 6/2006 | Matsui |
| 2006/0146531 A1 | 7/2006 | Reo |
| 2006/0181903 A1 | 8/2006 | Okuwaki |
| 2006/0187653 A1 | 8/2006 | Olsson |
| 2007/0058377 A1 | 3/2007 | Zampini, II |
| 2007/0064428 A1 | 3/2007 | Beauchamp |
| 2007/0092736 A1 | 4/2007 | Boardman |
| 2007/0103902 A1 | 5/2007 | Hsiao |
| 2007/0205425 A1 | 9/2007 | Harada |
| 2007/0206375 A1 | 9/2007 | Piepgras |
| 2007/0235751 A1 | 10/2007 | Radkov |
| 2007/0279727 A1 | 12/2007 | Gandhi |
| 2008/0048200 A1 | 2/2008 | Mueller |
| 2008/0080196 A1 | 4/2008 | Ruud |
| 2008/0144322 A1 | 6/2008 | Norfidathul |
| 2008/0165530 A1 | 7/2008 | Hendrikus |
| 2008/0212319 A1 | 9/2008 | Klipstein |
| 2008/0239755 A1 | 10/2008 | Parker |
| 2008/0244944 A1 | 10/2008 | Nall |
| 2008/0266900 A1 | 10/2008 | Harbers |
| 2008/0267572 A1 | 10/2008 | Sampsell |
| 2008/0298058 A1 | 12/2008 | Kan |
| 2008/0315228 A1 | 12/2008 | Krames |
| 2009/0021936 A1 | 1/2009 | Stimac |
| 2009/0026913 A1 | 1/2009 | Mrakovich |
| 2009/0109539 A1 | 4/2009 | Devos |
| 2009/0126792 A1 | 5/2009 | Gruhlke |
| 2009/0167203 A1 | 7/2009 | Dahlman |
| 2009/0185389 A1 | 7/2009 | Tessnow |
| 2009/0195168 A1 | 8/2009 | Greenfeld |
| 2009/0225546 A1 | 9/2009 | Pearson |
| 2009/0272996 A1 | 11/2009 | Chakraborty |
| 2009/0310354 A1 | 12/2009 | Zampini, II |
| 2009/0321766 A1 | 12/2009 | Chang |
| 2010/0008090 A1 | 1/2010 | Li |
| 2010/0033948 A1 | 2/2010 | Harbers |
| 2010/0060157 A1 | 3/2010 | Shi |
| 2010/0060202 A1 | 3/2010 | Melanson |
| 2010/0072488 A1 | 3/2010 | Bierhuizen |
| 2010/0141557 A1 | 6/2010 | Gruhlke |
| 2010/0237766 A1 | 9/2010 | Baumgartner |
| 2010/0246179 A1 | 9/2010 | Long |
| 2010/0254134 A1 | 10/2010 | McCanless |
| 2010/0308354 A1 | 12/2010 | David |
| 2011/0013387 A1 | 1/2011 | Kanade |
| 2011/0025951 A1 | 2/2011 | Jones |
| 2011/0051394 A1 | 3/2011 | Bailey |
| 2011/0051407 A1 | 3/2011 | St Ives |
| 2011/0051425 A1 | 3/2011 | Tsuchiya |
| 2011/0062470 A1 | 3/2011 | Bierhuizen |
| 2011/0089453 A1 | 4/2011 | Min |
| 2011/0122643 A1 | 5/2011 | Spork |
| 2011/0134634 A1 | 6/2011 | Gingrich, III |
| 2011/0136374 A1 | 6/2011 | Mostoller |
| 2011/0164426 A1 | 7/2011 | Lee |
| 2011/0193490 A1 | 8/2011 | Kumar |
| 2011/0198067 A1 | 8/2011 | Hada |
| 2011/0210364 A1 | 9/2011 | Nolan |
| 2011/0222270 A1 | 9/2011 | Porciatti |
| 2011/0255287 A1 | 10/2011 | Li |
| 2011/0280020 A1 | 11/2011 | Chen |
| 2011/0286222 A1 | 11/2011 | Coleman |
| 2011/0303935 A1 | 12/2011 | Chern |
| 2012/0002417 A1 | 1/2012 | Li |
| 2012/0025241 A1 | 2/2012 | Xiao |
| 2012/0025729 A1 | 2/2012 | Melanson |
| 2012/0051048 A1 | 3/2012 | Smit |
| 2012/0051056 A1 | 3/2012 | Derks |
| 2012/0051068 A1 | 3/2012 | Pelton |
| 2012/0087124 A1 | 4/2012 | Ravillisetty |
| 2012/0106152 A1 | 5/2012 | Zheng |
| 2012/0113676 A1 | 5/2012 | Van Dijk |
| 2012/0113678 A1 | 5/2012 | Cornelissen |
| 2012/0140474 A1 | 6/2012 | Jurik |
| 2012/0146066 A1 | 6/2012 | Tischler |
| 2012/0147621 A1 | 6/2012 | Holten |
| 2012/0170303 A1 | 7/2012 | Meir |
| 2012/0218750 A1 | 8/2012 | Klase |
| 2012/0250309 A1 | 10/2012 | Handsaker |
| 2012/0267650 A1 | 10/2012 | Schubert |
| 2012/0286304 A1 | 11/2012 | Letoquin |
| 2013/0021775 A1 | 1/2013 | Veerasamy |
| 2013/0021797 A1 | 1/2013 | Kubo |
| 2013/0021811 A1 | 1/2013 | Goldwater |
| 2013/0063939 A1 | 3/2013 | Kondo |
| 2013/0083524 A1 | 4/2013 | Devorris |
| 2013/0093980 A1 | 4/2013 | Goto |
| 2013/0134445 A1 | 5/2013 | Tarsa |
| 2013/0214691 A1 | 8/2013 | Chen |
| 2013/0249387 A1 | 9/2013 | Hsin |
| 2013/0265750 A1 | 10/2013 | Pickard |
| 2013/0272000 A1 | 10/2013 | Pearson |
| 2013/0274398 A1 | 10/2013 | Shiobara |
| 2013/0292709 A1 | 11/2013 | Tong |
| 2013/0313965 A1 | 11/2013 | Chiang |
| 2014/0001952 A1 | 1/2014 | Harris |
| 2014/0036500 A1 | 2/2014 | Richard |
| 2014/0043812 A1 | 2/2014 | Moreau |
| 2014/0168997 A1 | 6/2014 | Lee |
| 2014/0176016 A1 | 6/2014 | Li |
| 2014/0177262 A1 | 6/2014 | Lai |
| 2014/0268720 A1 | 9/2014 | Dungan |
| 2014/0268748 A1 | 9/2014 | Lay |
| 2014/0268810 A1 | 9/2014 | Marquardt |
| 2014/0334142 A1 | 11/2014 | Levante |
| 2014/0367633 A1 | 12/2014 | Bibl |
| 2015/0003105 A1 | 1/2015 | Goto |
| 2015/0034976 A1 | 2/2015 | Kim |
| 2015/0036387 A1 | 2/2015 | Myers |
| 2015/0041839 A1 | 2/2015 | Sakai |
| 2015/0062892 A1 | 3/2015 | Krames |
| 2015/0062965 A1 | 3/2015 | Oh |
| 2015/0117022 A1 | 4/2015 | Meir |
| 2015/0144918 A1 | 5/2015 | Cho |
| 2015/0145406 A1 | 5/2015 | Li |
| 2015/0241034 A1* | 8/2015 | Dankelmann ......... H05K 1/189 29/592.1 |
| 2015/0252982 A1 | 9/2015 | Demuynck |
| 2015/0276170 A1 | 10/2015 | Motoyanagi |
| 2015/0283768 A1 | 10/2015 | Marquardt |

(56) References Cited

U.S. PATENT DOCUMENTS

| | | |
|---|---|---|
| 2015/0316219 A1 | 11/2015 | Mallory |
| 2015/0326767 A1 | 11/2015 | Kim |
| 2016/0003424 A1 | 1/2016 | Wu |
| 2016/0035944 A1 | 2/2016 | Spanard |
| 2016/0076741 A1 | 3/2016 | Rong |
| 2016/0076743 A1 | 3/2016 | Deutsch |
| 2016/0093780 A1 | 3/2016 | Beppu |
| 2016/0170120 A1 | 6/2016 | Shani |
| 2016/0195225 A1 | 7/2016 | Carney |
| 2016/0201861 A1 | 7/2016 | Meir |
| 2016/0230958 A1 | 8/2016 | Pickard |
| 2016/0327249 A1 | 11/2016 | Pearson |
| 2016/0327256 A1 | 11/2016 | Hall |
| 2017/0009957 A1 | 1/2017 | Lim |
| 2017/0038015 A1 | 2/2017 | Lunz |
| 2017/0137627 A1 | 5/2017 | Szwarcman |
| 2017/0219170 A1 | 8/2017 | Petluri |
| 2017/0250319 A1 | 8/2017 | Yajima |
| 2017/0256693 A1 | 9/2017 | Yoshizawa |
| 2017/0261186 A1 | 9/2017 | Meir |
| 2017/0261187 A1 | 9/2017 | Meir |
| 2017/0309795 A1 | 10/2017 | Kim |
| 2017/0311422 A1 | 10/2017 | Arai |
| 2017/0343167 A1 | 11/2017 | Petluri |
| 2018/0100959 A1 | 4/2018 | Vasylyev |
| 2018/0113244 A1 | 4/2018 | Vasylyev |
| 2018/0238501 A1 | 8/2018 | Honda |
| 2019/0203889 A1 | 7/2019 | Petluri |
| 2019/0212492 A1 | 7/2019 | Meng |
| 2019/0219251 A1 | 7/2019 | Meir |
| 2019/0267523 A1 | 8/2019 | Min |
| 2019/0338918 A1 | 11/2019 | Ashraf |
| 2019/0383450 A1 | 12/2019 | Meir |
| 2020/0096178 A1 | 3/2020 | Aviram |
| 2020/0098732 A1 | 3/2020 | Meir |
| 2020/0141546 A1 | 5/2020 | Meir |
| 2020/0144468 A1 | 5/2020 | Meir |
| 2020/0158299 A1 | 5/2020 | Meir |
| 2020/0191370 A1 | 6/2020 | Shohat |
| 2021/0338861 A1 | 11/2021 | Harrison |
| 2021/0341134 A1* | 11/2021 | May ............... F21S 2/00 |
| 2022/0057049 A1 | 2/2022 | Hikmet |

FOREIGN PATENT DOCUMENTS

| | | |
|---|---|---|
| CN | 201590432 U | 9/2010 |
| CN | 201739849 U | 2/2011 |
| CN | 101997074 A | 3/2011 |
| CN | 202040752 U | 11/2011 |
| CN | 102269351 A | 12/2011 |
| EP | 0592746 B1 | 3/1997 |
| EP | 2256833 B1 | 4/2013 |
| EP | 2474775 B1 | 11/2013 |
| EP | 2484956 B1 | 6/2014 |
| ES | 1211538 U | 5/2018 |
| FR | 3058203 A1 | 5/2018 |
| GB | 2457016 A | 8/2009 |
| JP | 2011508406 T | 3/2011 |
| JP | 2011204495 A | 10/2011 |
| JP | 2011204658 A | 10/2011 |
| KR | 20070039683 | 4/2007 |
| KR | 20090013704 A | 2/2009 |
| KR | 100974942 B1 | 8/2010 |
| KR | 20110106033 | 9/2011 |
| KR | 20120050280 | 5/2012 |
| WO | 0215281 | 2/2002 |
| WO | 2013059298 A1 | 4/2013 |
| WO | 2014082262 A1 | 6/2014 |
| WO | 2014099681 A2 | 6/2014 |
| WO | 2014099681 A3 | 12/2014 |
| WO | 2015066184 A1 | 5/2015 |
| WO | 2018015449 | 1/2018 |
| WO | 2018140727 A1 | 8/2018 |
| WO | 2019193218 A1 | 10/2019 |
| WO | 2019213299 A1 | 11/2019 |
| WO | 2020131933 A1 | 6/2020 |
| WO | 2021021234 A1 | 2/2021 |

OTHER PUBLICATIONS

International Patent Application No. PCT/US2018/015449; Int'l Search Report and the Written Opinion; dated Jun. 14, 2018; 16 pages.

International Patent Application No. PCT/US2019/030252; Int'l Search Report and the Written Opinion; dated Oct. 4, 2019; 13 pages.

International Search Report and Written Opinion for Application No. PCT/US14/62905 dated Jan. 22, 2015, 10 pages.

International Search Report and Written Opinion dated Nov. 27, 2013 in PCT Application No. PCT/US2013/045708, 3 pages.

PCT/US2012/060588, "International Application Serial No. PCT/US2012/060588, International Preliminary Report on Patentability and Written Opinion dated May 1, 2014", Ecosense Lighting Inc et al., 7 Pages.

PCT/US2012/060588, International Application Serial No. PCT/US2012/060588, International Search Report and Written Opinion dated Mar. 29, 2013, Ecosense Lighting Inc et al., 10 pages.

PCT/US2013/075172, "International Application Serial No. PCT/US2013/075172, International Search Report and Written Opinion dated Sep. 26, 2014", Ecosense Lighting, Inc., 16 Pages.

PCT/US2014/062905, International Preliminary Report on Patentability dated May 3, 2016 (7 pp).

PCT/US2014/062905, Written Opinion of the Int'l Searching Authority dated Jan. 22, 2015 (6 pp).

* cited by examiner

LIGHTING SYSTEMS WITH HIGH COLOR RENDERING INDEX AND UNIFORM PLANAR ILLUMINATION

CROSS-REFERENCE TO RELATED APPLICATIONS

This application is a continuation of U.S. patent application Ser. No. 16/480,867 filed on Jul. 25, 2019, which is a U.S. National Stage patent application based on International Application No. PCT/US2018/015449 filed on Jan. 26, 2018, which claims the benefit under 35 U.S.C. § 119(e) of U.S. Provisional Application Ser. No. 62/451,612, titled "FLEXIBLE LINEAR STRIP" filed on Jan. 27, 2017 and of U.S. Provisional Application Ser. No. 62/451,616, titled "RECESS SLOT LIGHTING" filed on Jan. 27, 2017. Each one of the foregoing patent applications is hereby incorporated herein by reference in its entirety.

BACKGROUND

Light emitting diodes (LEDs) are typically formed from a semiconductor material that is doped to create a p-n junction. The LEDs typically emit light in a narrow spectrum (e.g., a spectrum that is smaller 200 nanometers in size) that is dependent upon the bandgap energy of the semiconductor material that forms the p-n junction. For example, an LED formed using one semiconductor material may emit light of a different color (and thereby in a different spectrum) than an LED formed using another semiconductor material.

White light has a broad spectrum (e.g., a spectrum that is larger than 200 nanometers in size), unlike the light typically emitted from a single LED. White light may be formed by mixing light with different colors (and thereby different spectrums) together. For example, white light may be formed by mixing red, green, and blue light or blue and yellow light. Inexpensive LEDs that create white light (a white LED) typically use an LED configured to emit blue light (a blue LED) that is coated with a yellow phosphor. The yellow phosphor coating converts a portion of the blue light from the LED into yellow light. The mixture of the blue and yellow light forms white light.

SUMMARY

According to at least one aspect, a lighting device having a top surface configured to provide light and a bottom surface opposite the top surface is provided. The lighting device comprises a circuit board, a light emitting diode (LED) mounted to the circuit board and configured to emit broad spectrum light having a first color rendering index (CRI) value toward the top surface of the lighting device, at least one photo-luminescent material disposed between the LED mounted to the circuit board and the top surface of the lighting device, the at least one photo-luminescent material being configured to increase the CRI of the broad spectrum light emitted by the LED from the first CRI value to a second CRI value that is higher than the first CRI value, and at least one elastomer encapsulating at least part of the circuit board.

In some embodiments, the LED is a white phosphor-converted LED configured to emit white light. In some embodiments, the broad spectrum light has a spectrum that is at least 200 nanometers in size.

In some embodiments, the second CRI value is at least 95. In some embodiments, the at least one photo-luminescent material is configured to increase an R9 color rendering value of the broad spectrum light emitted by the LED from a first R9 color rendering value to a second R9 color rendering value that is higher than the first R9 color rendering value. In some embodiments, the second R9 color rendering value is at least 95.

In some embodiments, the at least one photo-luminescent material is configured to change a color correlated temperature (CCT) of the broad spectrum light emitted by the LED from a first CCT value to a second CCT value that is different from the first value. In some embodiments, the first CCT value is higher than the second CCT value. In some embodiments, the first CCT value is at least 4000 degrees Kelvin (K) and the second CCT value is no more than 3000 degrees K. In some embodiments, the first CCT value is lower than the second CCT value. In some embodiments, the at least one photo-luminescent material is configured to absorb at least some light with a wavelength below 500 nanometers and emit at least some light with a wavelength above 500 nanometers.

In some embodiments, the lighting device is constructed to operate in both indoor installations and outdoor installations. In some embodiments, the lighting device is no more than ⅝ inches tall. In some embodiments, the lighting device is no more than 3 inches wide and no more than 6 inches long.

In some embodiments, the at least one elastomer comprises a first elastomer disposed between the circuit board and a bottom surface of the lighting device and a second elastomer disposed between the circuit board and the top surface of the lighting device that is different from the first elastomer. In some embodiments, the at least one photo-luminescent material is distributed through at least part of the second elastomer. In some embodiments, the first elastomer has different heat dissipation properties and the second elastomer. In some embodiments, the first elastomer is more porous than the second elastomer.

In some embodiments, the at least one photo-luminescent material is formed as a sheet that is at least partially encapsulated by the at least one elastomer. In some embodiments, the lighting device further comprises scattering particles disposed between the circuit board and the top surface of the lighting device and configured to scatter at least some broad spectrum light emitted from the LED. In some embodiments, the scattering particles are distributed through at least part of the at least one elastomer.

In some embodiments, the lighting device has an efficiency rating of at least 100 lumens per watt. In some embodiments, the at least one photo-luminescent material comprises at least one member selected from the group consisting of: a phosphor, a silicate, and a quantum dot. In some embodiments, the at least one photo-luminescent material comprises an organic material.

In some embodiments, the lighting device is constructed as a lighting strip and wherein the LED mounted to the circuit board is a first LED of a plurality of LEDs mounted to the circuit board along a length of the lighting strip. In some embodiments, the lighting device is configured to provide light within a 3-step Macadam ellipse of a predefined color coordinate along the length of the lighting strip. In some embodiments, the lighting device is configured to provide light within a 2-step Macadam ellipse of a predefined color coordinate along the length of the lighting strip.

According to at least one aspect, a lighting device having a top surface configured to provide light and a bottom surface opposite the top surface is provided. The lighting device comprises a circuit board, a plurality of light emitting diodes (LEDs) mounted to the circuit board and each configured to emit light toward the top surface of the lighting device, at least one first photo-luminescent material disposed over a first LED of the plurality of LEDs and configured to change at least one characteristic of the light emitted by the first LED, at least one second photo-luminescent material disposed over a second LED of the plurality of LEDs and configured to change at least one characteristic of the light emitted by the second LED, the at least one second photo-luminescent material being different from the at least one first photo-luminescent material, and at least one elastomer encapsulating at least part of the circuit board.

In some embodiments, at least one of the plurality of LEDs is configured to emit narrow spectrum light that has a spectrum of no more than 200 nanometers in size. In some embodiments, at least one of the plurality of LEDs is configured to emit broad spectrum light that has a spectrum of at least 200 nanometers in size. In some embodiments, the light emitted from the first LED has a different spectrum of the light emitted from the second LED.

According to at least one aspect, a grow light configured to emit light to stimulate plant growth is provided. The grow light comprises a circuit board, a light emitting diode (LED) mounted to the circuit board and configured to emit light toward a top surface of the lighting device, at least one photo-luminescent material disposed between the LED mounted to the circuit board and the top surface of the lighting device, the at least one photo-luminescent material being configured to absorb at least some light from the LED having a wavelength below 500 nanometers (nm) and emit at least some light having a wavelength between 625 nm and 675 nm, and at least one elastomer encapsulating at least part of the circuit board and being in direct contact with a top surface of the LED.

In some embodiments, the LED is configured to emit broad spectrum light that has a spectrum of at least 200 nanometers in size and includes light having a wavelength below 500 nm. In some embodiments, the LED is configured to emit narrow spectrum light that has a spectrum of no more than 200 nanometers in size and includes light having a wavelength below 500 nm. In some embodiments, the at least one photo-luminescent material is configured to absorb at least some light having a wavelength below 500 nm emitted by the LED.

According to at least one aspect, a lighting device having a top surface configured to provide light, a bottom surface opposite the top surface, a first lateral surface between the top and bottom surfaces, and a second lateral surface opposite the first lateral surface between the top and bottom surfaces is provided. The lighting device comprises a tray comprising a base that forms the bottom surface of the lighting device, a first sidewall that extends from the base and forms the first lateral surface of the lighting device, a second sidewall that extends from the base and forms the second lateral surface of the lighting device, and an overhang that extends from the second sidewall towards the first sidewall and is parallel to the base, a circuit board disposed in the tray having a first side in contact with the base and a second side that is opposite the first side, a light emitting diode (LED) mounted to the second side of the circuit board at a location that is under the overhang that extends from the second sidewall of the tray and being configured to emit broad spectrum light, and at least one elastomer that encapsulates at least part of the second surface of circuit board and is in contact with the first and second sidewalls of the tray.

In some embodiments, the lighting device further comprises at least one photo-luminescent material disposed between the second surface of the circuit board and the top surface of the lighting device and configured to change at least one characteristic of the broad spectrum light emitted by the LED. In some embodiments, the at least one characteristic comprises a characteristic selected from the list consisting of: a color correlated temperature, a color rendering index value, and an R9 color rendering value. In some embodiments, the at least one photo-luminescent material is at least partially encapsulated by the at least one elastomer. In some embodiments, the lighting device is constructed such that the light from the LED that reaches the top surface without being reflected by another surface of the lighting device is at an angle above the critical angle for total internal reflection.

According to at least one aspect, a lighting device having a top surface configured to provide light and a bottom surface opposite the top surface is provided. The lighting device comprises a tray comprising a base that is parallel to the bottom surface of the lighting device, a first sidewall that extends from the base towards the top surface of the lighting device, and a second sidewall that extends from the base towards the top surface of the lighting device and is parallel to the first sidewall, a circuit board disposed in the tray having a first side in contact with the base and a second side that is opposite the first side, a light emitting diode (LED) mounted to the second side of the circuit board and configured to emit broad spectrum light up to a maximum emission angle, a lens disposed over the LED configured to increase the maximum emission angle from a first value to a second value that is larger than the first value, a first elastomer that encapsulates at least part of the second surface of the circuit board and is in contact with only a first portion of the lens such that a second portion of the lens is left exposed, and a diffuser disposed between the lens and the top surface of the lighting device and being configured to diffuse the broad spectrum light.

In some embodiments, the lens comprises a cavity that faces the circuit board and wherein the LED is disposed within the cavity. In some embodiments, the LED is a white phosphor-converted LED configured to emit white light. In some embodiments, the broad spectrum light has a spectrum that is at least 200 nanometers in size. In some embodiments, the first value is no more than ±60 degrees and the second value is at least ±80 degrees.

In some embodiments, the lighting device further comprises a sleeve that receives the tray and comprises a bottom side disposed under the base of the tray and a top side disposed above the first and second sides of the tray so as to form an air gap between the second portion of the lens and the top side of the sleeve. In some embodiments, the diffuser is in disposed on the top surface of the sleeve. In some embodiments, the sleeve is constructed from silicone. In some embodiments, the tray is constructed from silicone.

In some embodiments, the distance between the top surface and the bottom surface of the lighting device is no more than ⅝ inches. In some embodiments, the top and bottom surfaces are each no more than 3 inches wide and no more than 6 inches long.

In some embodiments, the diffuser comprises a second elastomer that is different from the first elastomer. In some embodiments, the first elastomer has a first refractive index and the second elastomer has a second refractive index that is different from the first refractive index. In some embodiments, the first refractive index is smaller than the second refractive index. In some embodiments, the diffuser comprises a plurality of scattering particles distributed throughout the second elastomer. In some embodiments, the diffuser comprises at least one photo-luminescent material at least partially encapsulated by the second elastomer. In some embodiments, the at least one photo-luminescent material comprises at least one member selected from the group consisting of: a phosphor, a silicate, and a quantum dot. In some embodiments, the diffuser comprises a pigment distributed throughout the second elastomer.

According to at least one aspect, a lighting device having a top surface configured to provide light and a bottom surface opposite the top surface is provided. The lighting device comprises a tray comprising a base that is parallel to the bottom surface of the lighting device, a first sidewall that extends from the base towards the top surface of the lighting device, and a second sidewall that extends from the base towards the top surface of the lighting device and is parallel to the first sidewall, a circuit board disposed in the tray having a first side in contact with the base and a second side that is opposite the first side, a light emitting diode (LED) mounted to the second side of the circuit board and configured to emit broad spectrum light up to a maximum emission angle, a lens disposed over the LED configured to increase the maximum emission angle from a first value to a second value that is larger than the first value, at least one photo-luminescent material disposed between the LED mounted to the circuit board and the lens, the at least one photo-luminescent material being configured to change at least one characteristic of the light from the LED, a first elastomer that encapsulates at least part of the second surface of the circuit board and is in contact with only a first portion of the lens such that a second portion of the lens is left exposed, and a diffuser disposed between the lens and the top surface of the lighting device and being configured to diffuse the broad spectrum light.

In some embodiments, the at least one photo-luminescent material is configured to change at least one of: a color rendering index, an R9 color rendering value, and a color correlated temperature of the broad spectrum light emitted by the LED.

BRIEF DESCRIPTION OF THE DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

As discussed above, inexpensive white LEDs generally are constructed as white phosphor-converted LEDs where a blue LED is covered with a phosphor coating that converts a portion of the blue light from the LED to yellow light so as to create white light. However, these white phosphor-converted LEDs generally emit white light with a low color rendering index (CRI) value because the phosphor coating may allow a substantial portion of the blue light emitted from the LED to remain unconverted. As a result, the white light emitted from such inexpensive LEDs has a large blue component that decreases the CRI value of the white light. Conventionally, the CRI value of the white light emitted by a phosphor-converted LED is improved by adding a red LED that emits red light that mixes with the white light emitted by the phosphor-converted LED to increase the red component of the white light. The increased red component may balance out the large blue component of the white light emitted from the phosphor-converted LED and, thereby, increase the CRI value of the white light.

The inventors have appreciated that the conventional approach to produce white light with a high CRI value is expensive, complex, and inefficient. In particular, pairing the white phosphor-converted LEDs with red LEDs increases the total LED count in a lighting device, which increases the total cost of the device and the complexity of the electrical connections between each of the LEDs in the device. Further, the addition of the red LED decreases the power efficiency of the device (e.g., measured in lumens per watt) because the power consumption of the red LED is not balanced out by the small boost to the total lumens provided by the additional red light.

Figure 6:
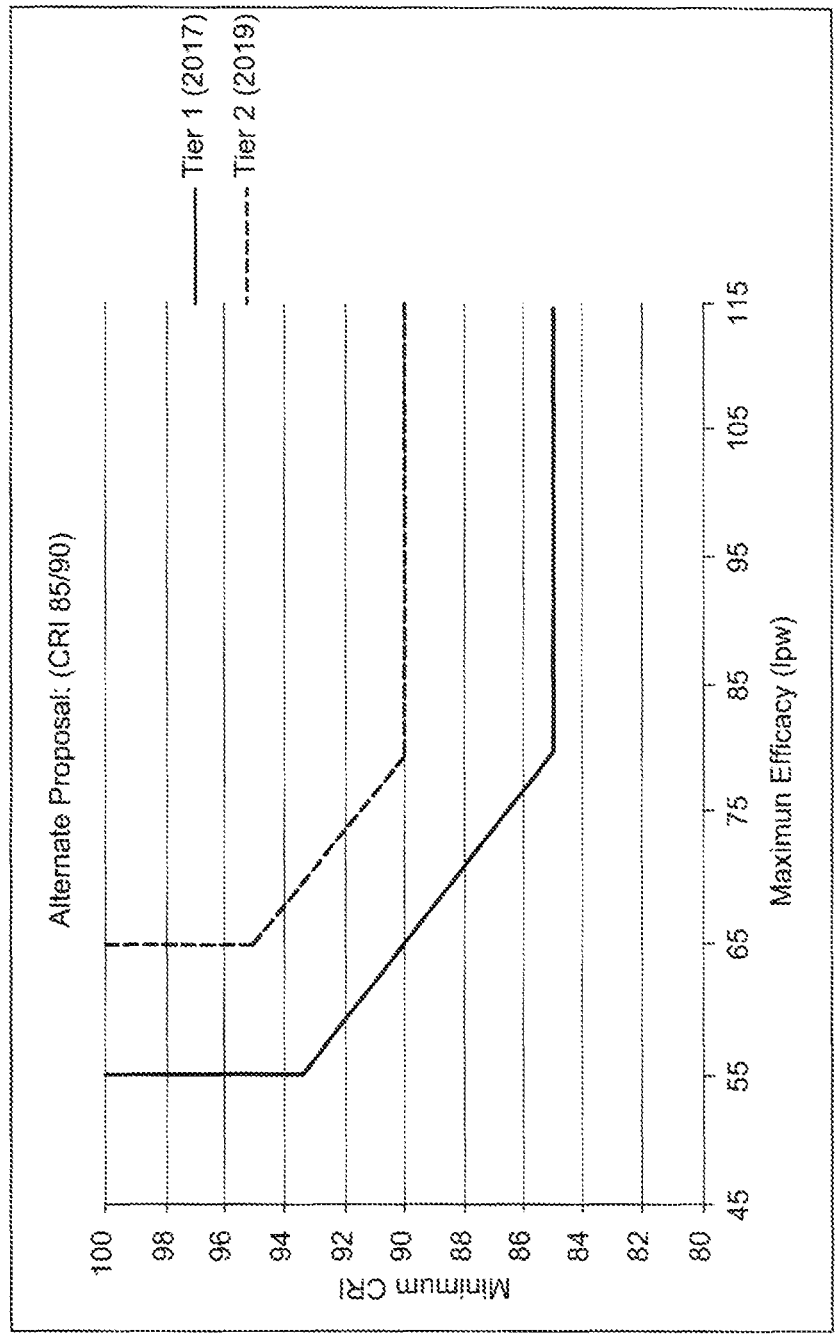
FIG. 6 is a graph showing the power efficiency requirements of high color rendering index (CRI) light sources, according to some embodiments of the technology described herein.

Accordingly, aspects of the present disclosure relate to lighting systems that produce broad spectrum light (e.g., white light) with a high CRI value (e.g., a CRI value of at least 95) using only broad spectrum LEDs (e.g., white phosphor-converted LEDs). Thereby, the additional cost, complexity, and power inefficiency created by pairing white phosphor-converted LEDs with red LEDs may be eliminated. Further, the lighting systems disclosed herein may have high power efficiency ratings that exceed the present and upcoming standards for LED lighting device power efficiency standards. FIG. 6 shows the power efficiency requirements for LED lighting devices proposed as part of the Codes and Standards Enhancement (CASE) Initiative Program. As shown, the minimum power efficiency for LED lighting devices with a minimum CRI of 95 on sale between 2017 and 2019 is approximately 55 lumens per watt and the minimum power efficiency for LED lighting devices with a minimum CRI of 95 sold in 2019 and thereafter is 65 lumens per watt. The lighting systems described herein may provide high CRI white light with power efficiencies that far exceed these standards. For example, the lighting systems described herein may have power efficiencies in excess of 100 lumens per watt.

In some embodiments, the CRI value of white light emitted by white LEDs (e.g., white phosphor-converted LEDs) is improved through the use of photo-luminescent materials. The photo-luminescent materials may be configured to be emit light in a first spectrum in response to being excited by light in a second different spectrum. For example, the photo-luminescent materials may be configured to absorb blue light and emit light with a longer wavelength (e.g., yellow light, red light, etc.). Thereby, the photo-luminescent materials may reduce the large blue component of the white light emitted by the white phosphor-converted LED and increase the components of light with longer wavelengths (e.g., red light). The resulting white light may have a substantially higher CRI than the white light emitted by the white phosphor-converted LED. Any of a variety of photo-luminescent materials may be employed. Example photo-luminescent material may include a phosphor (e.g., neodymium-doped yttrium aluminum garnet (Nd:YAG)), a silicate, and quantum dots (e.g., Cadmium-free quantum dots). The photo-luminescent material may be an organic material and/or comprise organic compounds. Additionally (or alternatively), the photo-luminescent material may be an inorganic material and/or comprise inorganic compounds.

The white LED in combination with the photo-luminescent material may be integrated into a lighting system in any of a variety of ways. In some embodiments, the lighting system may be implemented as an LED strip system comprising a plurality of interconnected LED strips each with a length of no more than approximately 6 inches, a width of no more than approximately 3 inches, and a height of no more than approximately ⅝ inches. In these embodiments, the LED strips may comprise a circuit board onto which an LED may be mounted. The LED may be configured to emit broad spectrum light (e.g., light has a spectrum that is at least 200 nanometers in size such as white light) having a first CRI value. At least one photo-luminescent material may be disposed between the LED mounted to the circuit board and the top surface of the lighting device increases the CRI of the broad spectrum light emitted by the LED from the first CRI value (e.g., no more than 80) to a higher, second CRI value (e.g., at least 95). The components of the LED strip may be at least partially encapsulated with an elastomer, such as silicone, to protect the components from the environment.

The inventors have additionally appreciated that LED lighting devices are generally unsuitable for direct viewing. In particular, the individual LEDs integrated into the device are generally discernable to a viewer because of their light intensity relative to other locations on the LED lighting device. As a result, LED lighting devices are generally employed in applications where the lighting device is not directly visible. For example, the LED lighting device may be positioned such that only the reflected light from the LEDs can be seen by a viewer.

Accordingly, aspects of the present disclosure relate to LED lighting devices that provide uniform (or near uniform) planar illumination along the LED lighting device. Thereby, these LED lighting devices may be employed in direct view applications, such as in recessed slots, unlike conventional LED lighting devices. The LED lighting devices may be configured to provide uniform (or near uniform) planar illumination in any of a variety of ways. In some embodiments, a lens may be placed over each LED in the lighting device that increases the maximum emission angle of the light from the LED to improve the distribution of the light. For example, the LED may emit light with a maximum emission angle of no more than ±60 degrees and the lens may increase the maximum emission angle of at least ±80 degrees. Additionally, a diffuser may be employed that diffuses the light from the lenses using any of a variety of materials, such as scattering particles.

The lens in combination with the diffuser may be integrated into a lighting system in any of a variety of ways. In some embodiments, the lighting system may be implemented as an LED strip system comprising a plurality of interconnected LED strips each with a length of no more than approximately 6 inches, a width of no more than approximately 3 inches, and a height of no more than approximately ⅝ inches. In these embodiments, the LED strips may comprise a tray having a base that is parallel to the bottom surface of the lighting device, a first sidewall that extends from the base towards the top surface of the lighting device, and a second sidewall that extends from the base towards the top surface of the lighting device and is parallel to the first sidewall. A circuit board may be disposed in the tray with an LED mounted thereon that faces the top of the lighting device. A lens may be disposed over the LED that is configured to increase the maximum emission angle of the light from the LED. The LED strip may be at least partially encapsulated with an elastomer that is in contact with the circuit board, the sidewalls of the tray, and only a portion of the lens such that part of the lens is left exposed (e.g., exposed to air). A diffuser may be disposed above the lens and configured to diffuse the light.

It should be appreciated that the embodiments described herein may be implemented in any of numerous ways. Examples of specific implementations are provided below for illustrative purposes only. It should be appreciated that these embodiments and the features/capabilities provided may be used individually, all together, or in any combination of two or more, as aspects of the technology described herein are not limited in this respect.

Figure 1A:
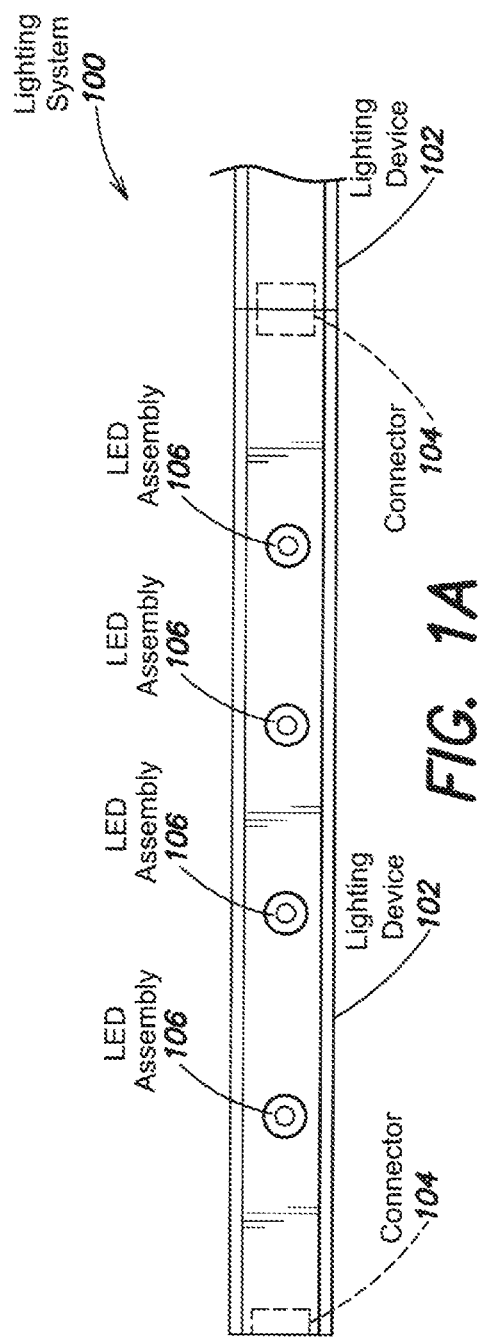
FIG. 1A shows a top view of an example lighting system, according to some embodiments of the technology described herein.
Figure 1B:
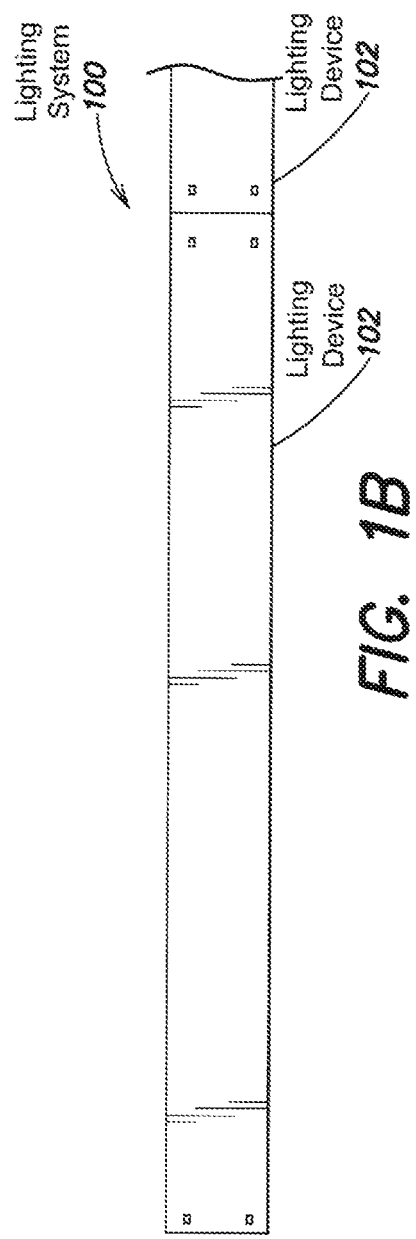
FIG. 1B shows a bottom view of the example lighting system of FIG. 1A, according to some embodiments of the technology described herein.

FIGS. 1A and 1B show top and bottom views, respectively, of an example lighting system 100. As shown, the lighting system 100 is constructed as a strip lighting system that comprises a plurality of electrically coupled lighting devices 102. Thereby, the length of the lighting system 100 may be customized by adding (or removing) lighting devices 102. Each of the lighting devices 102 may comprise LED assemblies 106 mounted to a circuit board that is at least partially encapsulated in at least one elastomer (e.g., silicone). The LED assemblies 106 may be electrically coupled via the circuit board to connectors 104 mounted on each end of the circuit board. In turn, the connector 104 may electrically couple each LED assemblies 106 to an external device such as another lighting device 102 or a power adapter. The LED assemblies 106 may receive power from the external device via the connector 104 and emit light.

The lighting devices 102 in the lighting system 100 may have particular dimensions to enable a wide range of applications. In some embodiments, the lighting devices 102 may be sized for mounting in recessed slots that are no more than 1 inch deep. In these embodiments, the lighting devices 102 may have, for example, a length of no more than approximately 6 inches, a width of no more than approximately 3 inches, and a height of no more than approximately 5/8 inches. Thereby, the lighting devices 102 may easily fit within the recessed slots. It should be appreciated that the lighting devices 102 may be constructed with other dimensions. For example, the lighting devices 102 may, in some embodiments, have a height in excess of approximately 5/8 inches.

The LED assemblies 106 may comprise an LED that is configured to emit light, such as a white phosphor-converted LED. The LED assemblies 106 may (or may not) comprise additional elements that change at least one characteristic of the light emitted by the LED. Example characteristics of the light emitted by the LED that may be changed include: a color correlated temperature (CCT) value, a CRI value, an R9 color index value, and an angle of emission. Any of a variety of elements may be employed to change the characteristics of the light emitted by the LED such as lenses, photo-luminescent materials, and/or scattering particles.

One or more components of the lighting device 102 may be mounted to a circuit board (e.g., a printed circuit board). For example, the LED assemblies 106 and/or the connectors 104 may be mounted to the circuit board. The circuit board may comprise one or more conductors to electrically couple the components mounted to the circuit board. The circuit board may be flexible to enable the lighting device 102 to bend to conform to uneven surfaces.

The circuit board may be at least partially encapsulated in at least one elastomer, such as a silicone and/or a rubber. The elastomer may insulate the circuit board and/or components mounted to the circuit board, such as the LED assembly 106 and the connector 104, from the external environment. Thereby, the lighting system 100 may be employed in both indoor and outdoor applications.

Figure 2A:
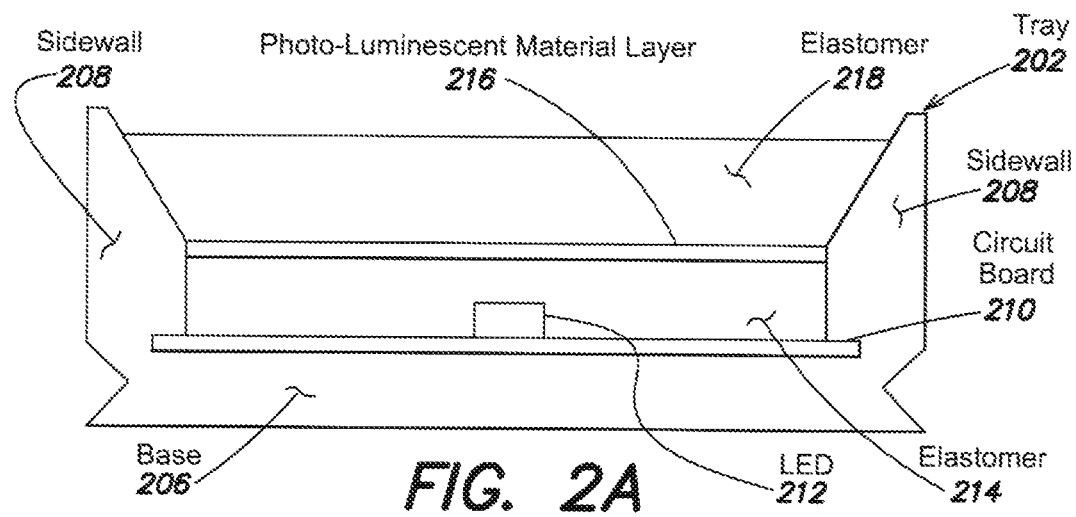
FIG. 2A shows a cross-sectional view of an example lighting device, according to some embodiments of the technology described herein.
Figure 2B:
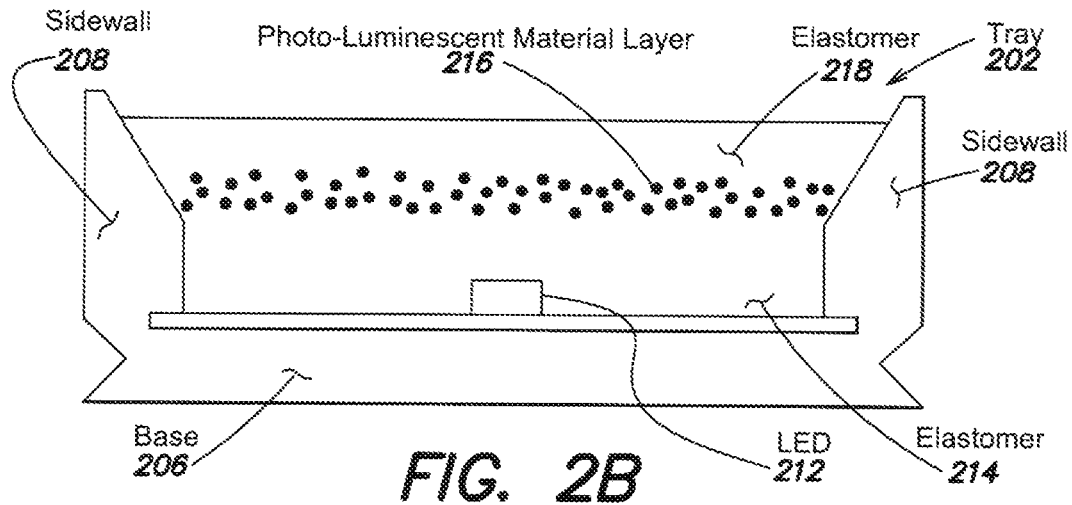
FIG. 2B shows a cross-sectional view of another example lighting device, according to some embodiments of the technology described herein.
Figure 2C:
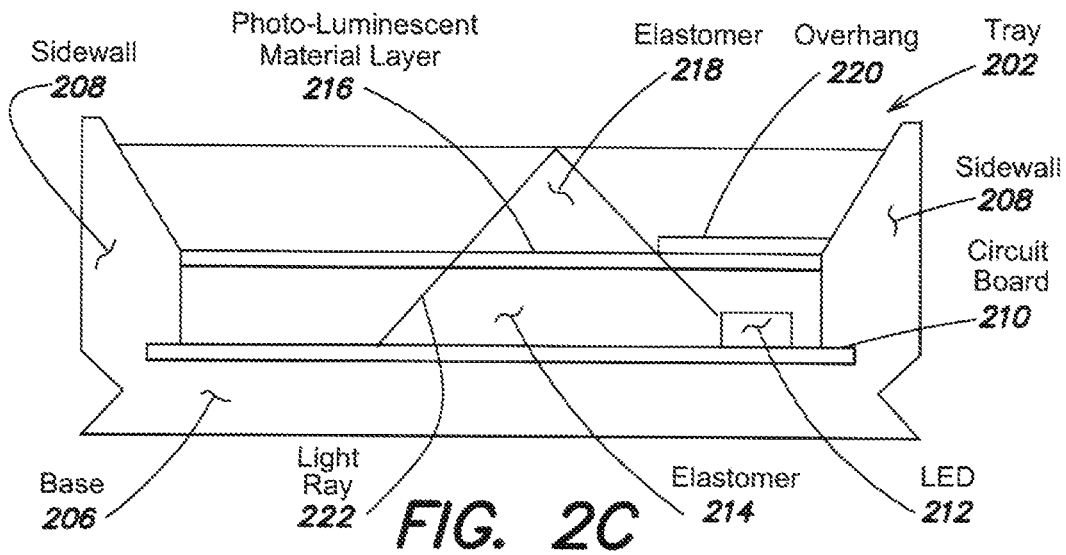
FIG. 2C shows a cross-sectional view of another example lighting device, according to some embodiments of the technology described herein.

Each of FIGS. 2A-2C shows a cross-section of an example implementation of the lighting device 102 shown in FIG. 1 that is designed to provide white light with a high CRI. As shown, the lighting device comprises a tray 202 that is configured to receive a circuit board 210 with an LED 212 mounted thereon. An elastomer 214 may be potted over the circuit board 210 to at least partially encapsulate the circuit board 210 and secure the circuit board 210 to the lighting device. A photo-luminescent material layer 216 is disposed on top of the elastomer 214 and may be configured to change at least one characteristic of the light emitted by the LED 212 such as CRI, R9 color rendering value, and/or CCT. Another elastomer 218 may be potted over the photo-luminescent material layer 216 to separate the photo-luminescent material layer 216 from the environment.

The tray 202 may comprise a base 206 onto which the circuit board 210 may be disposed and sidewalls 208 that extend upward from the base 206. The sidewalls 208 may be parallel to each other and/or perpendicular to the base 206. The base 206 may form a bottom surface of the lighting device while the sidewalls 208 may form the lateral surfaces of the lighting device. The tray 202 may be constructed from any of a variety of materials. For example, the tray 202 may be constructed from an elastomer such as silicone. In this example, the elastomer may be manufactured through an extrusion process (e.g., a silicone extrusion process). The elastomer employed to construct the tray 202 may be different from the elastomers 214 and/or 218. For example, the elastomer in the tray 202 may be more porous than the elastomers 214 and/or 218 to provider greater heat dissipation capability to dissipate heat from the circuit board 210 and/or the LED 212.

In some embodiments, the tray 202 may comprise an overhang 220 that extends from one of the sidewalls 208 towards another sidewall 208 as shown in FIG. 2C. The overhang 220 may be parallel to the base 206. In these embodiments, the LED 212 may be mounted to the circuit board 210 at a location that is under the overhang 220. Thereby, the LED 212 may be obscured from view. Further, the overhang 220 may be long enough such that the light ray 222 emitted at the maximum emission angle of the LED 212 does not directly leave the lighting device. Instead, the light ray 222 may reach the top surface of the elastomer 218 at such an angle that the light ray 222 is reflected back from the top surface (e.g., because the angle is above the critical angle for total internal reflection (TIR)). Thereby, all of the light emitted by the LED 212 may be reflected off of at least one surface in the lighting device before leaving the top surface of the elastomer 218.

The circuit board 210 may be configured to electrically couple the LED 212 to one or more other components. For example, the circuit board may comprise conductors that electrically couple the LED 212 to a connector mounted to the circuit board (e.g., connector 204 in FIG. 1A). The circuit board 210 may be, for example, an FR4 printed circuit board (PCB). Additionally (or alternatively), the circuit board may be a flexible circuit board 210 to permit the lighting device to bend without breaking.

The LED 212 may be configured to emit broad spectrum light, such as light with a spectrum that is at least 200 nanometers (nm) in size (e.g., 200 nm, 225 nm, 250 nm, 275 nm, 300 nm, etc.). The broad spectrum light may be, for example, white light. The LED 212 may be construed in any of a variety of ways to generate the broad spectrum light. For example, the LED 212 may be constructed as a white phosphor-converted LED. It should be appreciated that the LED 212 may be configured to emit narrow spectrum light in some embodiments, such as light with a spectrum that is less than 200 nm in size. For example, the LED 212 may be constructed as a blue LED without a phosphor coating.

Figure 7:
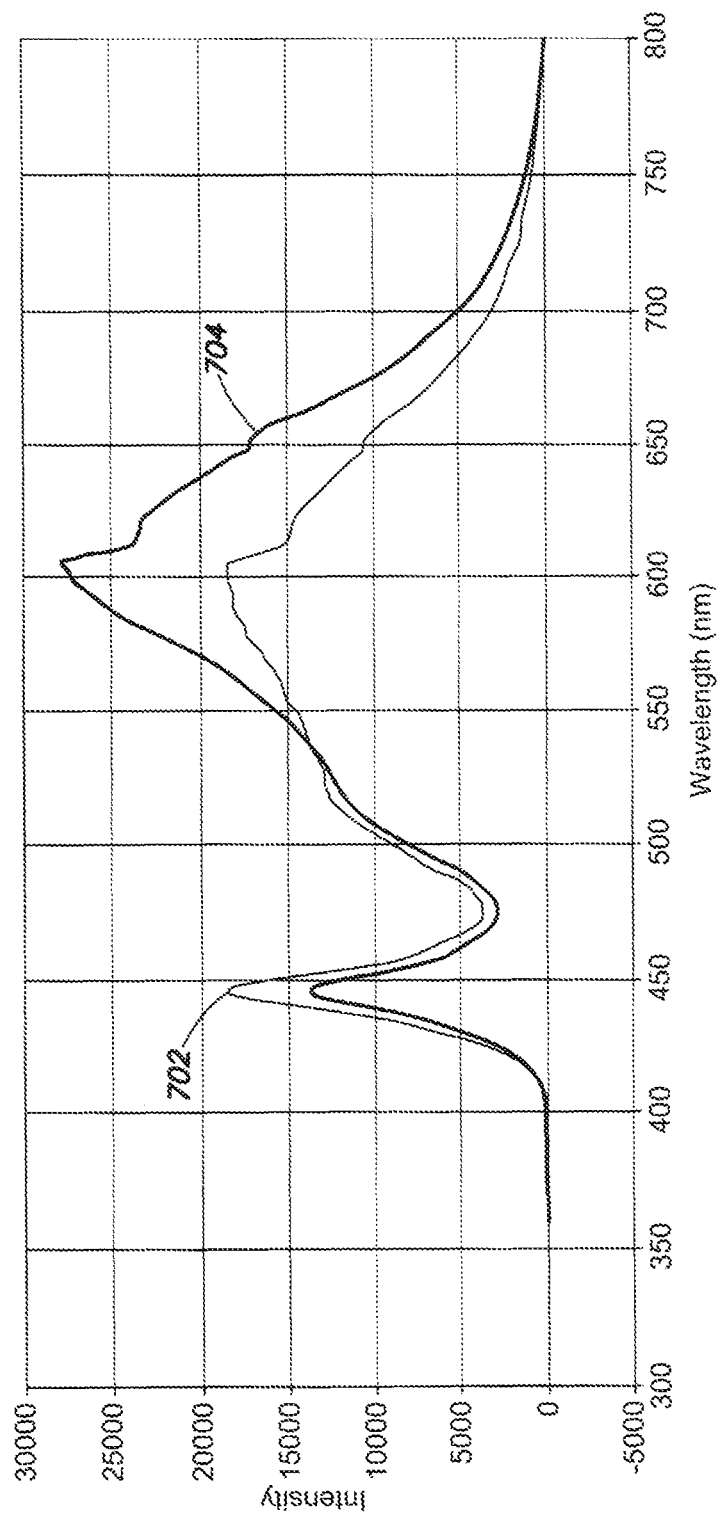
FIG. 7 is a graph showing the spectrum of light emitted by example lighting devices with different elastomer configurations, according to some embodiments of the technology described herein.

The elastomer 214 may be potted over the circuit board 210 to hold the circuit board 210 in-place in the lighting device. The elastomer 214 may, in some embodiments, be in direct contact with the LED 212. Allowing the elastomer 214 to be in direct contact with the LED 212 may, for example, change the spectrum of the light emitted by the LED 212 because the elastomer 214 may have a refractive index that is higher than air (e.g., a refractive index of approximately 1.5). FIG. 7 shows the difference between the spectrums of the light emitted from the LED 212 when the light is emitted directly into elastomer 214 instead of air. In particular, a first line 702 shows the spectrum of light from the LED 212 that is emitted directly into elastomer 214 and a second line 704 shows the spectrum of light from the LED 212 that is emitted directly into air. As shown, the blue component between approximately 425 nm and 475 nm of the light from the LED 212 is substantially increased when the light is emitted directly into the elastomer 214. The additional blue component of the light from the LED 212 may be advantageously employed to excite photo-luminescent materials in the photo-luminescent material layer 216. Thereby, the blue component of the light from the LED 212 may be converted into light with longer wavelengths, such as yellow and/or red light, by the photo-luminescent material layer 216.

The photo-luminescent material layer 216 may comprise one or more photo-luminescent materials that are configured to emit light in a first spectrum in response to being excited by light in a second different spectrum. For example, the photo-luminescent materials may be configured to absorb light with a shorter wavelength, such as blue light, and emit light with a longer wavelength, such as yellow and/or red light. The particular photo-luminescent materials and their respective proportions in the photo-luminescent material layer 216 may depend on, for example, the desired spectrum of light to be generated by the lighting device. Example photo-luminescent materials include a phosphor (e.g., neodymium-doped yttrium aluminum garnet (Nd:YAG)), a silicate, and a quantum dot (e.g., a Cadmium free quantum dot). The photo-luminescent material may be an organic material and/or comprise organic compounds such as any of the color conversion materials described in U.S. Patent Publication No. 2017/0137627. Additionally (or alternatively), the photo-luminescent material may be an inorganic material and/or comprise inorganic compounds.

The photo-luminescent material layer 216 may be constructed in any of a variety of ways. For example, the photo-luminescent material layer 216 may be formed as a sheet (e.g., as a foil) that is sandwiched between elastomer 214 and 218 and comprises a set of one or more photo-luminescent materials as shown in FIGS. 2A and 2C. In another example, the photo-luminescent material layer 216 may be constructed as a plurality of separate elements (e.g., separate circular sheets) that are each disposed over an LED on the circuit board 210. Thereby, the separate elements may be uniquely configured for the specific LED that the respective element is disposed over (e.g., a first element with a first composition may be disposed over a first LED and a second element with a second, different composition may be disposed over a second, different LED). In yet another example, the photo-luminescent material layer 216 may comprise a set of one or more photo-luminescent materials distributed through a polymer (e.g., silicone) that is sandwiched between elastomer 214 and 218 as shown in FIG. 2B.

Figure 8:
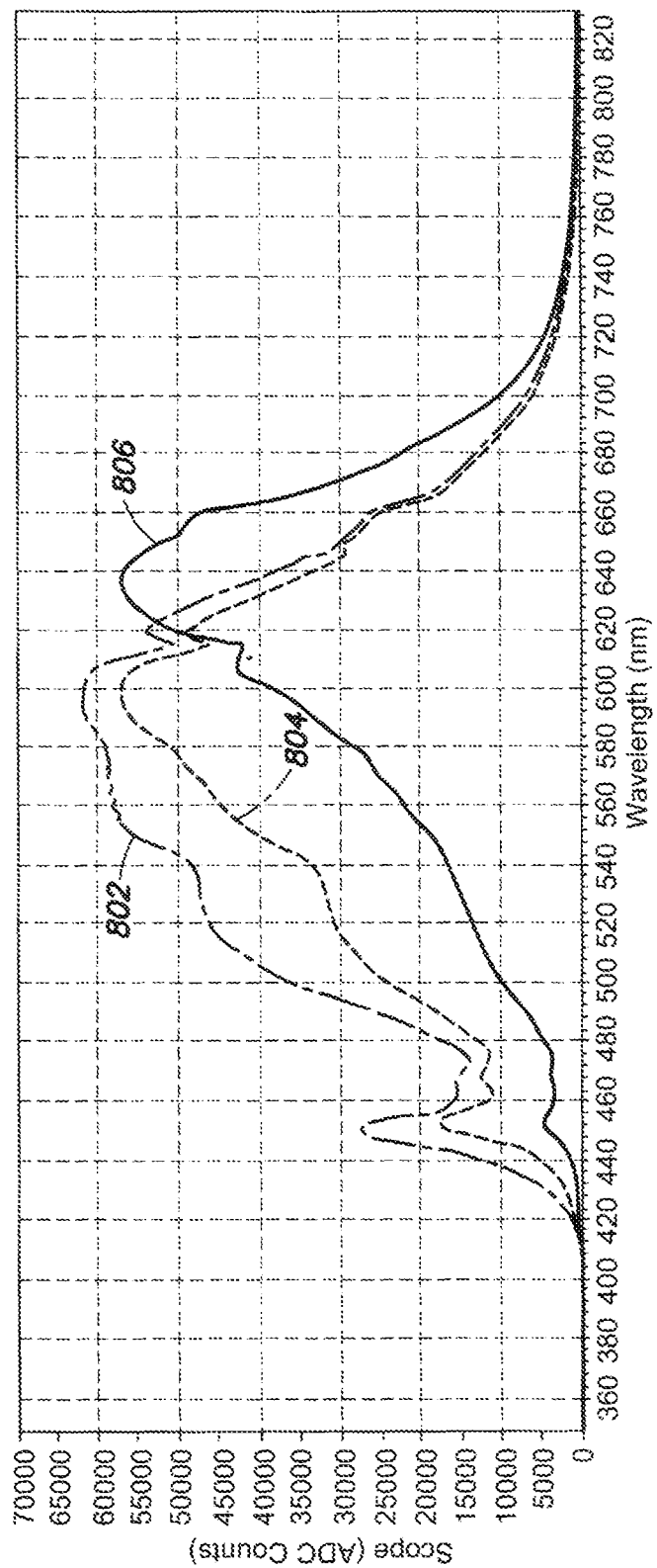
FIG. 8 is a graph showing the spectrum of light emitted by example lighting devices with different photo-luminescent materials, according to some embodiments of the technology described herein.

FIG. 8 shows the changes to the light spectrum that may be created by the photo-luminescent materials in the photo luminescent layer 216. In particular, a first line 802 shows the spectrum of light from a white phosphor-converted LED without any change from a photo-luminescent material, a second line 804 shows the spectrum of light from the white phosphor-converted LED after passing through a first quantum dot material, and a third line 806 shows the spectrum of light from the white phosphor-converted LED after passing through a different, second quantum dot material. A summary of the changes in the spectrum caused by each of the first and second quantum dot materials is shown in Table 1 below:

TABLE 1

| Element in FIG. 8 | Light Source | CCT | CRI | R9 |
|---|---|---|---|---|
| 802 | No photo-luminescent material | 4000 | 86 | 25 |
| 804 | First Quantum Dot material | 3300 | 91 | 45 |
| 806 | Second Quantum Dot material | 2000 | 96 | 80 |

As shown, the first quantum dot material increases the CRI, CCT, and R9 color rendering value of the white light by reducing the blue component of the white light and the second quantum dot material further increases the CRI, CCT, and R9 color rendering value of the white light by further reducing the blue component of the white light in addition to increasing the red component of the white light.

Figure 9:
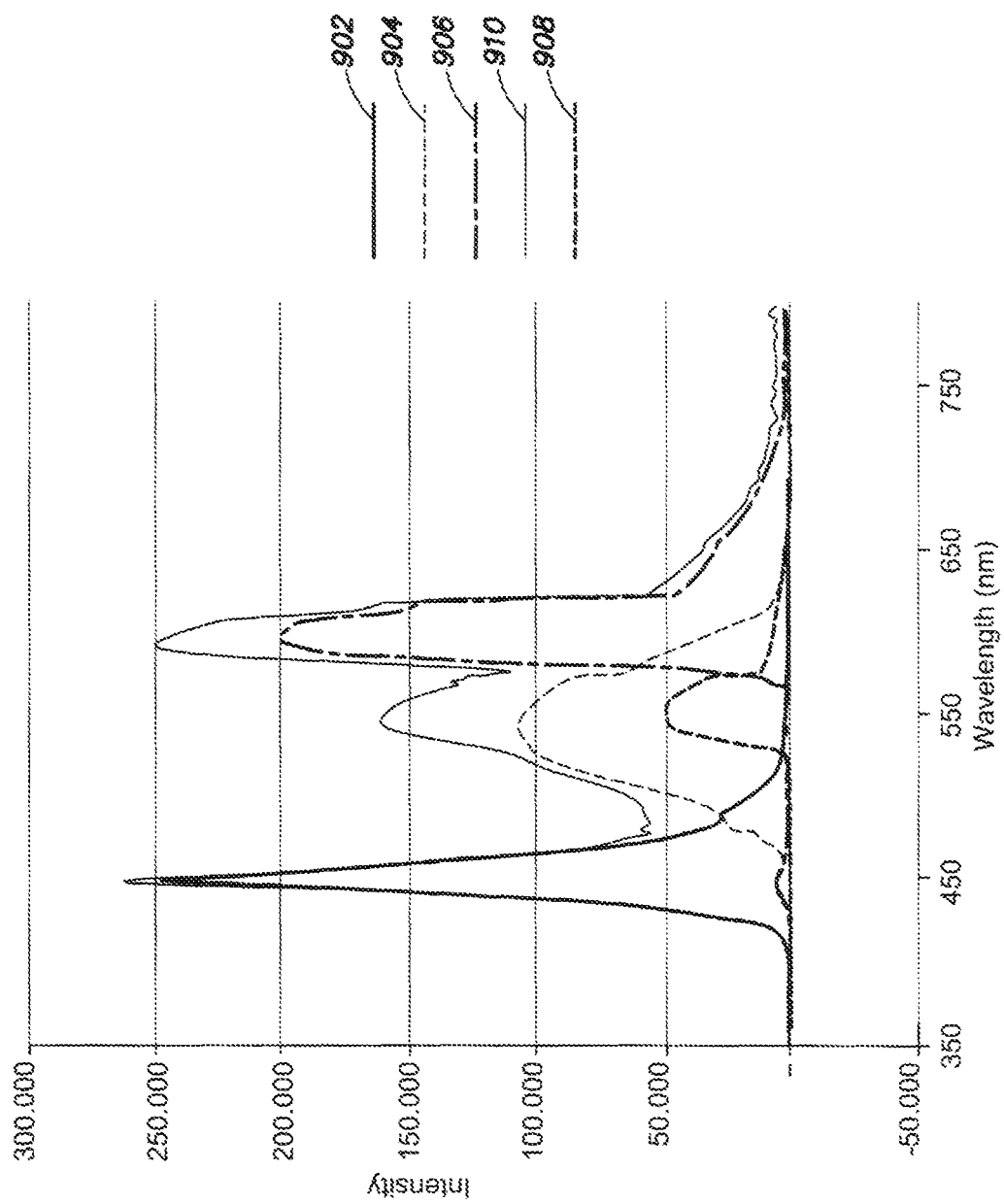
FIG. 9 is a graph showing the spectrum of light emitted by each component of an example lighting device for a back lighting unit (BLU), according to some embodiments of the technology described herein.

The composition of the photo-luminescent material layer 216 may be customize to achieve a desired light spectrum for any of a variety of different applications. For example, the photo-luminescent material layer 216 may be designed to provide light suitable for black light units (BLUs) in display applications. In this example, the LED 212 may be configured to emit narrow spectrum light (e.g., blue light) and the photo-luminescent material layer 216 may be configured to absorb some of the blue light and, in turn, emit light with a longer wavelength (e.g., green, yellow, orange, and/or red light). FIG. 9 shows the spectrum of light emitted by each component of such a lighting device that employs a red quantum dot material, a green quantum dot material, and yellow green (e.g., CIE Color Coordinates of x=3.14 and y=0.584) phosphor material in the photo-luminescent material layer 216. The ratio of the red quantum dot material to the green quantum dot material may be 80:20 (i.e., there are 80 parts of red quantum dot material for every 20 parts of green quantum dot material). In FIG. 9, line 902 shows the spectrum of light from a blue LED, line 904 shows the spectrum light from the yellow green phosphor material, line 906 shows the spectrum of light emitted by the excited red quantum dot material, line 908 shows the spectrum of light emitted by the excited green quantum dot material, and line 910 that shows the resulting spectrum of the lighting device (e.g., a combination of the spectrums of the blue LED, the phosphor, the red quantum dot material, and the green quantum dot material). Other combinations of materials may be employed to achieve a similar spectrum. For example, the green quantum dot material may be removed entirely and replaced with additional red quantum dot material. Thereby, the photo-luminescent layer 216 may omit the green quantum dot material altogether.

Figure 10:
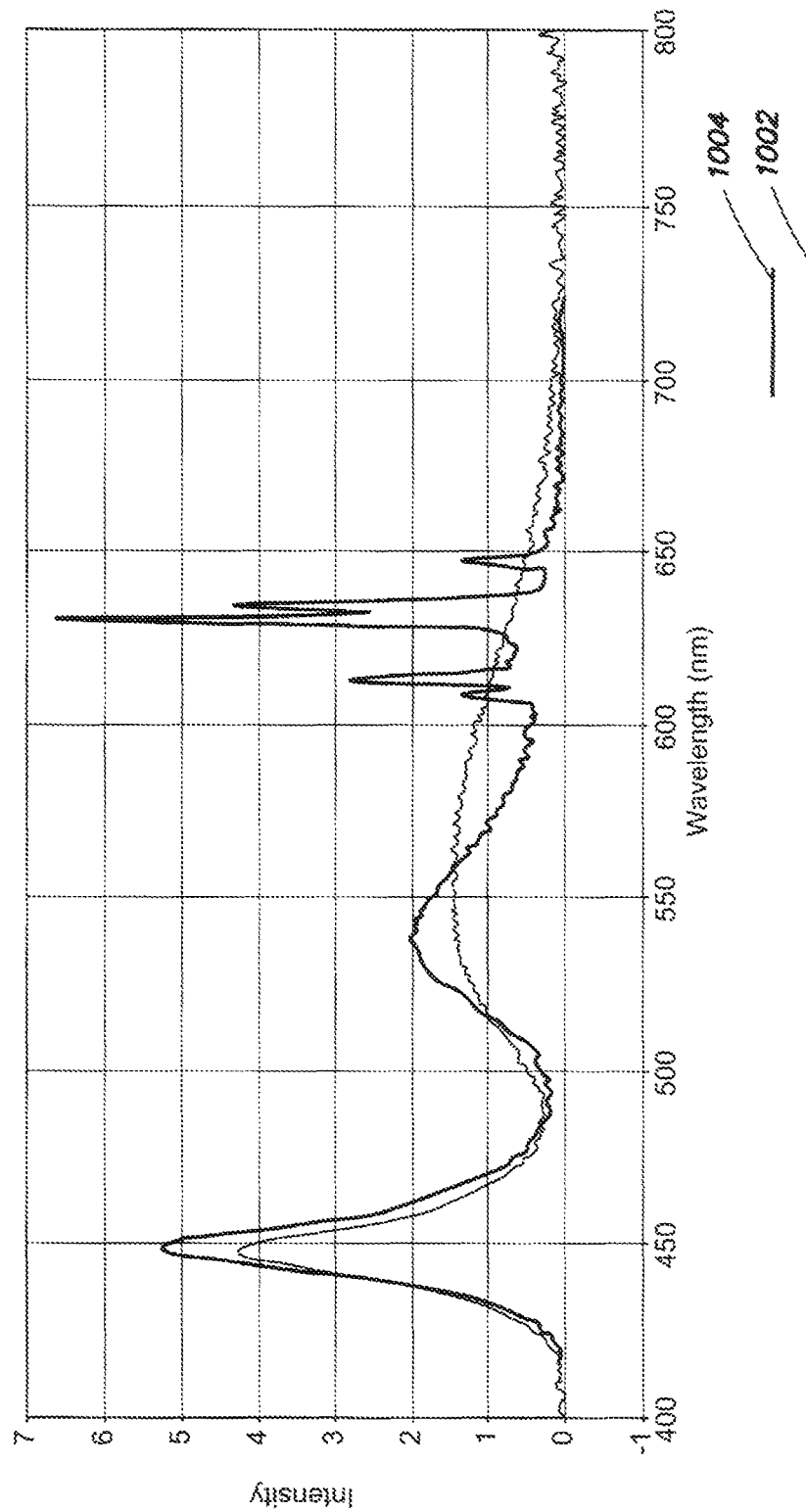
FIG. 10 is a graph showing the spectrum of another example lighting device for a BLU, according to some embodiments of the technology described herein.

The photo-luminescent material layer 216 for a lighting device being employed in BLUs where the LED 212 emits light with a broad spectrum (instead of a narrow spectrum) may be designed differently. FIG. 10 shows the spectrum of another example lighting device suitable for a BLU that is constructed using a broad spectrum LED. In particular, line 1002 shows the light spectrum of a white phosphor-converted LED formed from a blue LED coated in a yellow phosphor coating and line 1004 shows the light spectrum of a white phosphor-converted LED formed from a blue LED coated in a red phosphor coating paired with a photo-luminescent material in the photo-luminescent material layer 216 that is configured to absorb some of the blue light and emit green light. As shown, the light spectrum of the light from the phosphor-converted LED and photo-luminescent material layer 216 produces light with a warmer color temperature than employing the white phosphor-converted LED alone.

As should be appreciated from the foregoing description, the spectrum of a lighting device may be adjusted to achieve a desired light spectrum by varying the types and/or concentrations of photo-luminescent materials in the photo-luminescent material layer 216. For example, the red component of the light emitted by the lighting device may be increased by adding a red quantum dot material to the photo-luminescent material layer 216. Thereby, the lighting device described herein may be employed to create light for any of a variety of applications.

Figure 11:
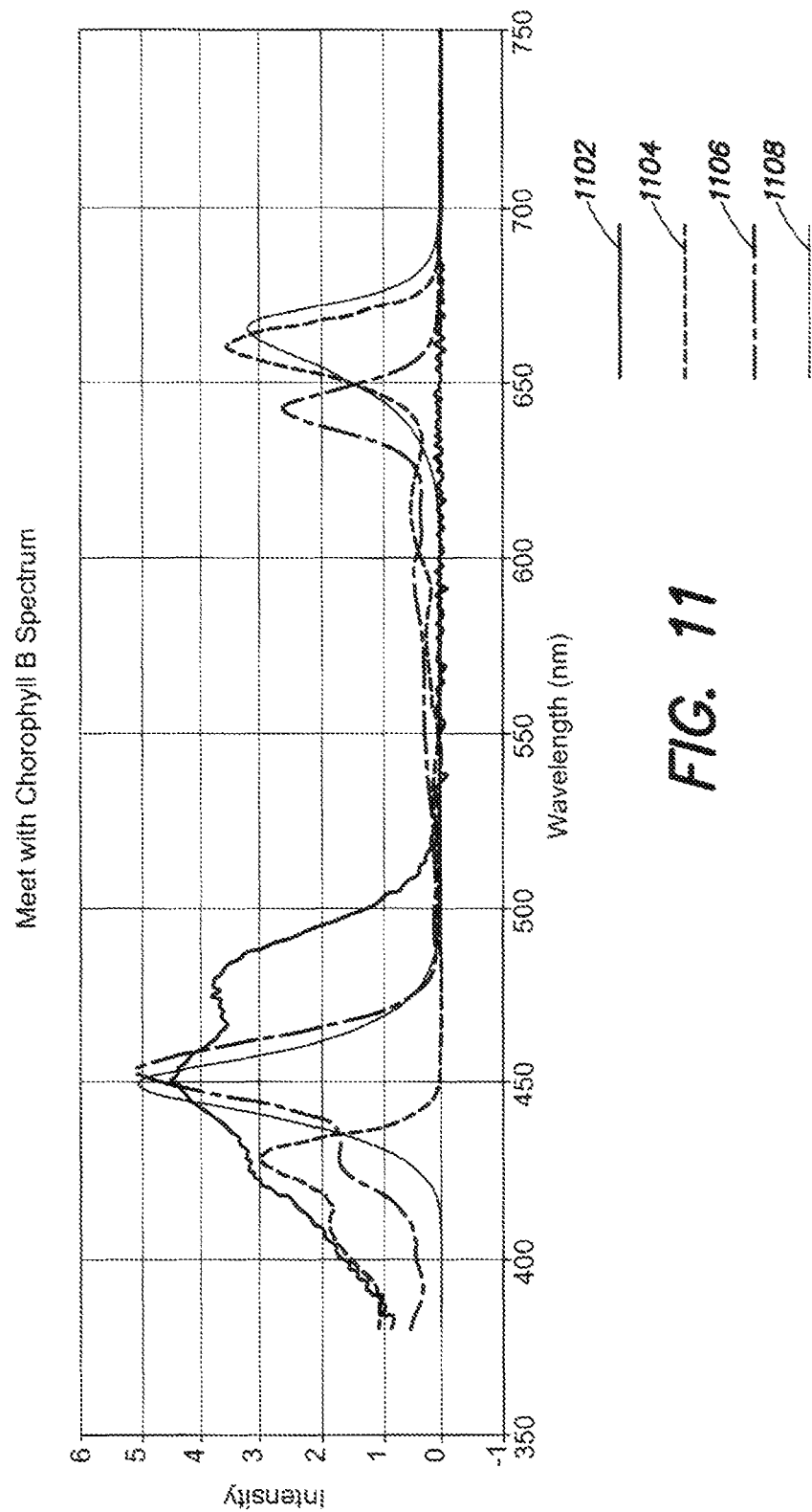
FIG. 11 is a graph showing the spectrum of light emitted by an example lighting device compared with the spectrum of light absorbed by different chlorophylls and beta carotene, according to some embodiments of the technology described herein.

In some embodiments, the composition of the photo-luminescent material layer 216 may be designed for grow light applications. Thereby, the lighting devices described herein may be constructed as grow lights configured to stimulate plant growth. In these embodiments, the spectrum of the light generated by the lighting device may, for example, closely match the spectrum of light absorbed by plants. Such a spectrum may be achieved by, for example, selecting a narrow spectrum LED that emits light with a wavelength below 500 nm (e.g., a blue LED) or a broad spectrum LED that emits a substantial portion light with a wavelength below 500 nm (e.g., a phosphor-converted white LED) for the LED 212 and adding photo-luminescent materials to the photo-luminescent material layer 216 that absorb some of the light below 500 nm from the LED and emit orange and/or red light (e.g., light with a spectrum between 600 nm and 700 nm). Further, the LED 212 may be in direct contact with the elastomer 214 to increase the component of short wavelength light (e.g., light with a wavelength below 500 nm) as described above with reference to FIG. 7. FIG. 11 shows the spectrum of light emitted by an example grow light compared with the spectrum of light absorbed by different chlorophylls and beta carotene. In particular, line 1102 shows the spectrum of light absorbed by beta carotene, line 1104 shows the spectrum of light absorbed by chlorophyll A, line 1106 shows the spectrum of light absorbed by chlorophyll B, and line 1108 shows the spectrum of light the example grow light. As shown, the spectrum of the light from the example grow light closely approximates the light absorbed by chlorophyll A and chlorophyll B. Further, the spectrum includes little light in portions of the spectrum that a plant would not absorb (e.g., between 525 and 600 nm) to improve the power efficiency of the grow light.

As should be appreciated from the foregoing, the photo-luminescent material layer 216 may comprise any of a variety of photo-luminescent materials. Further, the particular composition of the photo-luminescent material layer 216 may vary based on the desired light spectrum, which may vary based on the particular application.

Returning to FIGS. 2A-2C, the photo-luminescent material layer 216 may be covered by the elastomer 218. The elastomer 218 may be, for example, silicone. The elastomer 218 may have the same or different characteristics, such as refractive index, relative to the elastomer 214. For example, the elastomer 218 may have a different (e.g., higher or lower) refractive index than the elastomer 214.

It should be appreciated that photo-luminescence materials may be integrated into portions of the lighting device separate from the photo-luminescence material layer 216. For example, the elastomer 218 and/or the elastomer 214 may comprise a photo-luminescence material such as a phosphor. Additionally (or alternatively), other materials separate from photo-luminescence materials, such as scattering particles and/or pigments, may be integrated into any of the following components of the lighting device: the elastomer 214, the elastomer 218, the photo-luminescence material layer 216, and/or the tray 202.

The lighting device shown in FIGS. 2A-2C may be manufactured in any of a variety of ways. The lighting device may be manufactured by, for example, performing the following steps: (1) mounting the electronic components (e.g., the LED 212) to the circuit board 210; (2) inserting the circuit board into the tray 202; (3) potting the elastomer 214 over the circuit board 210 in the tray 202; (4) depositing the photo-luminescent material layer 216 on the elastomer 214; and (5) potting the elastomer 218 over the photo-luminescent material layer 216; and (6) packaging the lighting device.

As discussed above, the lighting device may be configured to provide uniform planar illumination in some embodiments. Thereby, the location of the LEDs within the lighting device may be indistinguishable to a viewer. These lighting devices may be employed in any of a variety of direct view applications including architectural lighting, commercial lighting, hospitality lighting, residential lighting, office lighting, hallway lighting, bath lighting, and vanity lighting. For example, the lighting device may be employed in 1 inch slot to create a glare free, architectural lighting accent within ⅝ inch deep drywall. In this example, the plaster in aluminum extrusion within ⅝" deep may house 1-2 lighting devices. These lighting devices may be constructed as strips, such as the LED strips shown in FIGS. 1A and 1B, that may advantageously allow the lighting devices to achieve continuous runs in various installation situations such as: outside corners, inside corners, T-connections, and fully seamless corners.

Figure 3:
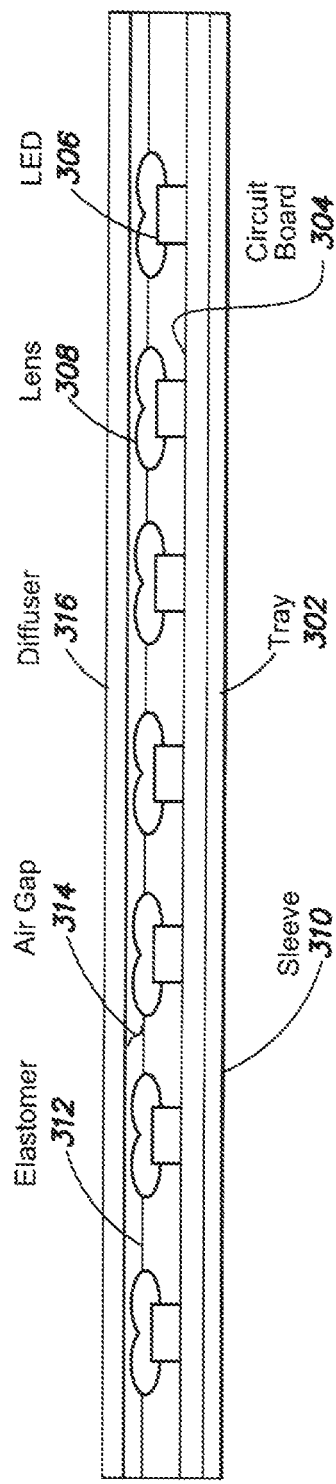
FIG. 3 shows a cross-sectional view of an example lighting device with integrated lenses, according to some embodiments of the technology described herein.
Figure 4:
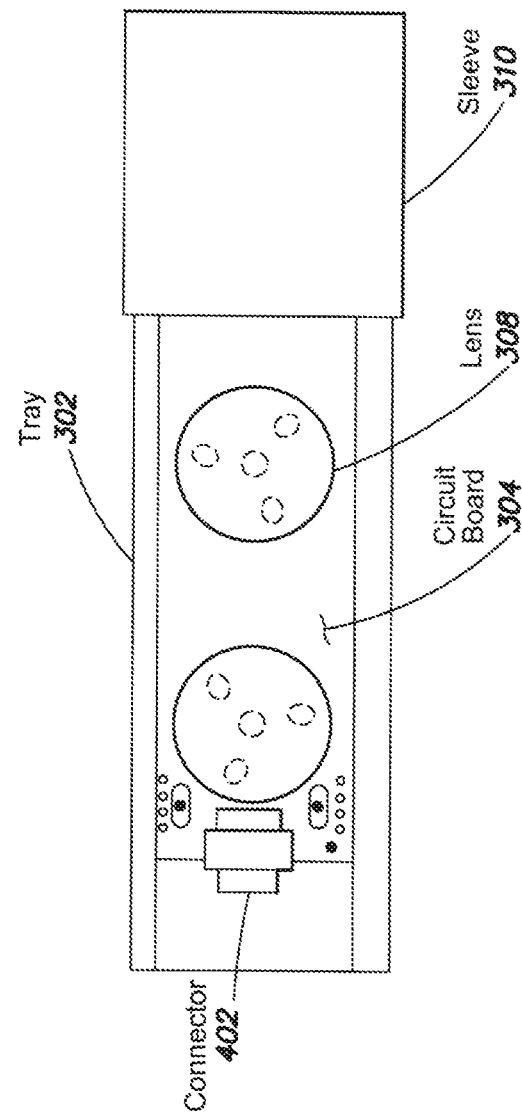
FIG. 4 shows a top view of a deconstructed version of the lighting device of FIG. 3, according to some embodiments of the technology described herein.

The lighting device may employ any of a variety of devices to provide uniform planar illumination such as lenses and diffusive elements. FIGS. 3 and 4 shows an example implementation of lighting device 102 that provides uniform planar illumination. In particular, FIG. 3 shows an example cross-section of the example lighting device and FIG. 4 shows a deconstructed version of the example lighting device. As shown, the lighting device comprises a tray 302 into which a circuit board 304 with LEDs 306 mounted thereon may be disposed. The tray 302, circuit board 304, and LEDs 306 may be constructed similarly (or identically) to the tray 202, the circuit board 210, and the LED 212, respectively, described above. The circuit board 306 may comprise a connector 402 that may electrically couple the LEDs 306 mounted on the circuit board 306 to an external power source. A lens 308 may be disposed over the LEDs 306 (e.g., so as to provide an air gap between the LEDs 306 and an inner surface of the lens 308) and configured to increase a maximum emission angle of light from the LED 306. The lens 308 may be only partially encapsulated in an elastomer 312 so as to expose a top portion of the lens 308 to air. A sleeve 310 may be slid over the tray 302 so as to provide an air gap 314 between the top of the lens 308 and the top side of the sleeve 310. A diffuser 316 may be disposed on the sleeve 310 that is configured to diffuse light from the LEDs 308.

Figure 5:
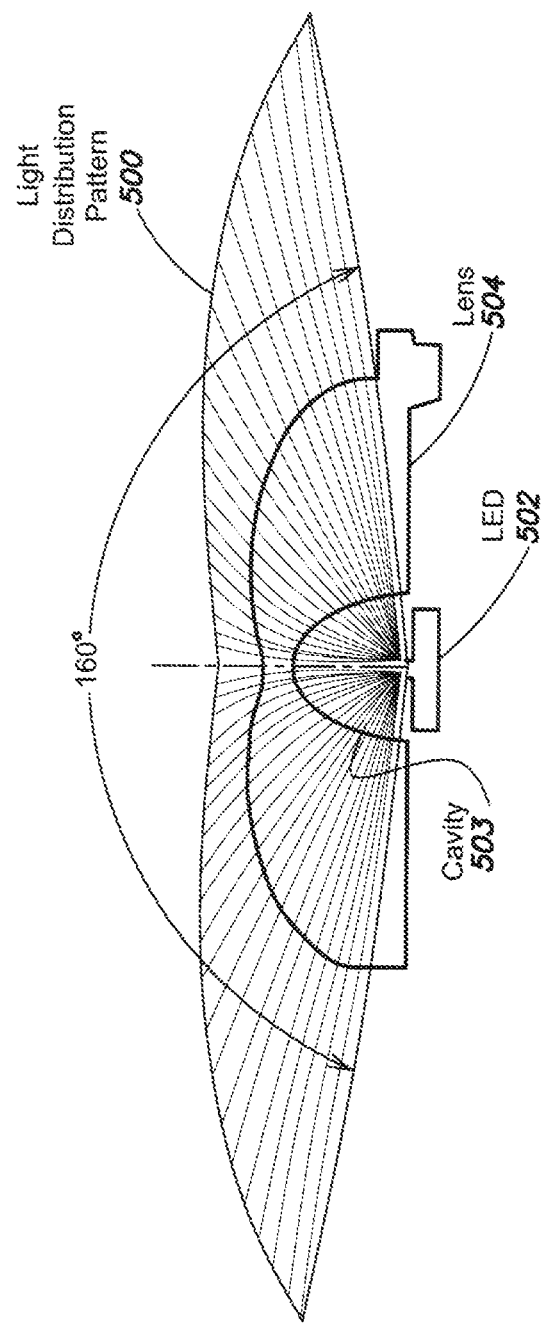
FIG. 5 shows a cross-sectional view of an example lens, according to some embodiments of the technology described herein.

The lenses 308 may be configured to increase a maximum emission angle of light from the LEDs 308. For example, the maximum emission angle of light from the LEDs 308 may be no more than ±60 degrees and the lens 308 may increase the maximum emission angle of the light from the LEDs to at least ±80 degrees. Additionally, the lens 308 may be configured to increase a light intensity at higher angles. For example, the light intensity from the LED 306 at ±60 degrees may be a first value and the lens 308 may increase the light intensity at ±60 degrees to a second value that is higher than the first value. An example construction of the lenses 308 is shown in FIG. 5 by lens 504 that is disposed over the LED 502. As shown, the lens 504 comprises a cavity 503 into which the LED 502 may be disposed. The cavity 503 may form an air gap between the LED 502 and an inner surface of the lens 504. Additional materials may be disposed in the cavity 503 between the LED 502 and the inner surface of the lens 504 that are configured to change a characteristic of the light from the LED such as any of the scattering particles, photo-luminescence materials, and/or pigments described herein. These materials may be, for example, integrated into a polymer to form a monolithic element that may be disposed between the LED 502 and the inner surface of the lens 504.

The lens 504 is configured to increase the maximum angle of emission to ±80 degrees resulting in light being emitted over a span of 160 degrees in the light distribution pattern 500. It should be appreciated that the example construction of the lens 308 in FIG. 5 is only one possible implementation and that the lens 504 may be implemented in any of a variety of ways.

The elastomer 312 may encapsulate the top surface of the circuit board 304 and only a portion of the lenses 308. For example, the elastomer 312 may only be in contact with a bottom portion of the outer surface of the lens 308 while leaving an upper portion of the outer surface of the lens 308 exposed to air. Leaving a portion of the lens 308 may advantageously improve the performance the lens by, for example, maximizing a difference in refractive index of the lens 308 itself and the material into which the light from the lens propagates (e.g., air). The elastomer 312 may be constructed from any of a variety of materials, such as silicone. The elastomer 312 may have a lower refractive index such as a refractive index of approximately 1.4.

The sleeve 310 may be constructed as to be a hollow rectangle prism that surrounds the tray 302 and the components mounted therein. The sleeve 310 may be constructed from an elastomer, such as silicone. The sleeve 310 may be constructed from an extruding process (e.g., a silicone extruding process).

The diffuser 316 may be constructed to diffuse the light from the lenses 308 so as to provide uniform (or near uniform) planar illumination. The diffuser 316 may be configured to diffuse light using any of a variety of techniques. In some embodiments, the diffuser 316 may comprise scattering particles that are configured to scatter light that are distributed throughout an elastomer (e.g., silicone) with a different (e.g., lower or higher) refractive index than the elastomer 312. For example, the refractive index of the elastomer 312 may have a refractive index of approximately 1.4 and the refractive index of the elastomer in the diffuser 316 may be approximately 1.5. The scattering particles may advantageously allow the diffuser 316 to be thin while still allowing the diffuser to effectively diffuse the light from the LEDs. For example, the entire lighting device (including the diffuser) may be no more than 5/8 inches tall. Thereby, the lighting device may easily be mounted in 1 inch recessed slots without protruding from the slot. Any of a variety of scattering particles may be employed such as Barium Sulfate (BaSO$_4$) and/or Titanium Dioxide (TiO$_2$). Additionally (or alternatively), the diffuser 316 may comprise one or more materials that are configured to change a characteristic of the light such as any of the photo-luminescence materials described herein and/or pigments.

The lighting device shown in FIGS. 3 and 4 may be manufactured in any of a variety of ways. The lighting device may be manufactured by, for example, performing the following steps: (1) mounting the electronic components (e.g., the LED 306 and/or the connector 402) to the circuit board 304; (2) inserting the circuit board into the tray 302; (3) placing the lenses 308 over the LEDs 306; (4) potting the elastomer 312 over the circuit board 304 in the tray 302; (5) inserting the tray 302 into the sleeve 310; (6) potting the material that comprises the diffuser 316 (e.g., an elastomer with scattering particles, photo-luminescence materials, and/or pigments) over the sleeve 310; and (7) packaging the lighting device.

It should be appreciated that the lighting devices described herein may be designed to achieve any of a variety of desired light output characteristics. For example, the lighting devices described herein may be designed for a range of CCT values such as, 2,700 degrees K, 3,000 degrees K, 3,500 degrees K, 4,000 degrees K, and 5,000 degrees K; a range of CRI values such as any value between 90 and 100; a range of R9 color rendering values such as any value between 90 and 100; a range of light intensity values such as a range of 270-480 lumens per 12 inch section of lighting devices (e.g., per pair of two 6 inch lighting devices); a range of power consumption levels such as any wattage up to 9 Watts; and a range of voltage levels such as 24 Volts. Further, the lighting devices may be configured to be dimmable via any of a variety of external dimmable electronic drivers. Still yet further, the lighting device may configured to provide light within a 3-step Macadam ellipse and/or a 2-step Macadam ellipse of a predefined color coordinate. For example, the lighting device may be configured as a lighting strip configured to provide light within a 3-step Macadam ellipse and/or a 2-step Macadam ellipse of a predefined color coordinate along the length of the lighting strip.

Various aspects of the present disclosure may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately," "about," and "substantially" may be used to mean within ±20% of a target value in some embodiments, within ±10% of a target value in some embodiments, within ±5% of a target value in some embodiments, and yet within ±2% of a target value in some embodiments. The terms "approximately," "about," and "substantially" may include the target value.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having described above several aspects of at least one embodiment, it is to be appreciated various alterations, modifications, and improvements will readily occur to those skilled in the art. Such alterations, modifications, and improvements are intended to be object of this disclosure. Accordingly, the foregoing description and drawings are by way of example only.

What is claimed is:
1. A strip lighting device, comprising:
    a tray having a base forming a bottom surface of the strip lighting device, a first sidewall extending upward from the base towards a top surface of the strip lighting device, and a second sidewall being spaced apart across the base from the first sidewall and extending upward from the base towards the top surface of the strip lighting device;

a circuit board in the tray, the circuit board having a first side facing toward the base and a second side facing toward the top surface of the strip lighting device;

a plurality of light emitting diodes (LEDs) being mutually spaced apart and being mounted on the second side of the circuit board to emit light emissions having a range of emission angles up to a maximum emission angle;

a first elastomer layer in the tray, the first elastomer layer having a first side facing toward the second side of the circuit board and having a second side facing toward the top surface of the strip lighting device;

a second elastomer layer in the tray, the second elastomer layer functioning as a diffuser and having a first side facing toward the second side of the first elastomer layer and having a second side facing toward the top surface of the strip lighting device; and a light-reflective overhang being sandwiched between the second side of the first elastomer layer and the first side of the second elastomer layer, the overhang extending from the second sidewall toward the first sidewall;

wherein each one of the plurality of the LEDs is located between the overhang and the second side of the first elastomer layer; and wherein the overhang and the diffuser cause the strip lighting device to emit the light emissions as a line of light having uniform intensity.

2. The lighting device of claim 1, including a plurality of lenses, each one of the plurality of lenses being over a respective one of the plurality of the LEDs for increasing the maximum emission angle from a first value to a second value that is larger than the first value, wherein the lenses and the overhang and the diffuser cause the strip lighting device to emit the light emissions as a line of light having uniform intensity.

3. The strip lighting device of claim 2, wherein the plurality of the lenses and the diffuser cause the strip lighting device to emit the line of the light emissions as being included in planar illumination having uniform intensity.

4. The strip lighting device of claim 2, wherein each one of the plurality of the lenses includes a respective one of a plurality of cavities that face toward the second side of the circuit board and wherein each one of the plurality of the LEDs is within the respective one of the plurality of the cavities.

5. The strip lighting device of claim 1, wherein the overhang extends for a sufficient distance toward the first sidewall so that some light emissions from the plurality of the LEDs, upon directly reaching the top surface of the strip lighting device without having been reflected by the overhang, are subject to total internal reflection.

6. The strip lighting device of claim 1, wherein the first elastomer layer and the second elastomer layer are positioned in the tray for causing some of the light emissions to successively pass through the first and second elastomer layers before reaching the top surface of the strip lighting device.

7. The strip lighting device of claim 1, wherein the first value of the maximum emission angle is no more than about sixty (60) degrees and the second value of the maximum emission angle is at least about eighty (80) degrees.

8. The strip lighting device of claim 1, further including a sleeve that receives the tray and includes a bottom side of the sleeve under the base of the tray and includes a top side of the sleeve above the first and second sidewalls of the tray forming an air gap between the plurality of the lenses and the top side of the sleeve.

9. The strip lighting device of claim 8, wherein the diffuser is over the top side of the sleeve.

10. The lighting device of claim 9, wherein the diffuser forms the top surface of the strip lighting device.

* * * * *